United States Patent
Perisetty

(10) Patent No.: US 7,355,437 B2
(45) Date of Patent: Apr. 8, 2008

(54) LATCH-UP PREVENTION CIRCUITRY FOR INTEGRATED CIRCUITS WITH TRANSISTOR BODY BIASING

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 93 days.

(21) Appl. No.: 11/369,654

(22) Filed: Mar. 6, 2006

(65) Prior Publication Data

US 2007/0205801 A1  Sep. 6, 2007

(51) Int. Cl.
H03K 19/007 (2006.01)
G06F 7/38 (2006.01)

(52) U.S. Cl. .......................... 326/14; 326/44; 327/534; 327/536; 327/537

(58) Field of Classification Search ................. 326/14, 326/26, 27, 44, 45; 327/534, 535, 536, 537
See application file for complete search history.

(56) References Cited

U.S. PATENT DOCUMENTS

| | | | |
|---|---|---|---|
| 5,341,034 A | 8/1994 | Matthews | |
| 5,422,591 A | 6/1995 | Rastegar et al. | |
| 5,610,533 A | 3/1997 | Arimoto et al. | |
| 5,689,144 A | 11/1997 | Williams | |
| 5,703,522 A | 12/1997 | Arimoto et al. | |
| 5,744,996 A | 4/1998 | Kotzle et al. | |
| 5,781,062 A | 7/1998 | Mashiko et al. | |
| 5,841,694 A | 11/1998 | Wong | |
| 5,852,552 A * | 12/1998 | Kwon ........................... | 363/60 |
| 5,854,561 A | 12/1998 | Arimoto et al. | |
| 5,905,402 A | 5/1999 | Kim et al. | |
| 5,942,784 A | 8/1999 | Harima et al. | |
| 6,157,691 A | 12/2000 | Wei | |
| 6,232,793 B1 | 5/2001 | Arimoto et al. | |
| 6,271,713 B1 | 8/2001 | Krishnamurthy | |

(Continued)

FOREIGN PATENT DOCUMENTS

EP  0 732 796 A2  9/1996

OTHER PUBLICATIONS

U.S. Appl. No. 11/420,736, filed May 27, 2006.

(Continued)

*Primary Examiner*—Daniel Chang
(74) *Attorney, Agent, or Firm*—G. Victor Treyz

(57) ABSTRACT

An integrated circuit such as a programmable logic device integrated circuit is provided that contains body-biased metal-oxide-semiconductor transistors and latch-up prevention circuitry to prevent latch-up from occurring in metal-oxide-semiconductor transistors. Body bias signals can be received from an external source or generated internally. Body bias paths are used to distribute the body bias signals to the body terminals of the metal-oxide-semiconductor transistors. The latch-up prevention circuitry may include active n-channel and p-channel metal-oxide-semiconductor transistor latch-up prevention circuitry. The latch-up prevention circuitry monitors the states of power supply signals to determine whether a potential latch-up condition is present. If the latch-up prevention circuitry determines that a core logic power supply signal and ground power supply have become valid while a body bias signal is not valid, a body bias path can be clamped at a safe voltage to prevent latch-up from occurring in the metal-oxide-semiconductor transistors.

24 Claims, 14 Drawing Sheets

U.S. PATENT DOCUMENTS

| | | | |
|---|---|---|---|
| 6,292,639 B1 | 9/2001 | Inoue et al. | |
| 6,343,044 B1 | 1/2002 | Hsu et al. | |
| 6,351,176 B1 | 2/2002 | Houston | |
| 6,366,482 B1 | 4/2002 | Jeong | |
| 6,373,281 B1 | 4/2002 | Chuang et al. | |
| 6,429,726 B1 | 8/2002 | Bruneau et al. | |
| 6,476,372 B2 | 11/2002 | Merrill et al. | |
| 6,484,265 B2 | 11/2002 | Borkar et al. | |
| 6,525,559 B1 | 2/2003 | Wu et al. | |
| 6,535,034 B1 | 3/2003 | Wong | |
| 6,549,032 B1 | 4/2003 | Shumarayev et al. | |
| 6,559,708 B2 | 5/2003 | Notani | |
| 6,590,440 B1 | 7/2003 | Williams et al. | |
| 6,597,203 B2 | 7/2003 | Forbes | |
| 6,605,981 B2 | 8/2003 | Bryant et al. | |
| 6,614,688 B2 | 9/2003 | Jeong et al. | |
| 6,650,141 B2 | 11/2003 | Agrawal et al. | |
| 6,670,655 B2 | 12/2003 | Lukes et al. | |
| 6,731,158 B1 | 5/2004 | Hass | |
| 6,744,301 B1 | 6/2004 | Tschanz et al. | |
| 6,777,978 B2 | 8/2004 | Hart et al. | |
| 6,972,593 B1 | 12/2005 | Wang et al. | |
| 6,972,599 B2 | 12/2005 | Forbes | |
| 6,980,033 B2 | 12/2005 | Forbes | |
| 7,098,689 B1 | 8/2006 | Tuan et al. | |
| 7,112,997 B1 | 9/2006 | Liang et al. | |
| 2001/0012673 A1 | 8/2001 | Gyu-chul | |
| 2002/0005750 A1 | 1/2002 | Kao et al. | |
| 2002/0024378 A1 | 2/2002 | Forbes et al. | |
| 2002/0029352 A1 | 3/2002 | Borkar et al. | |
| 2002/0030533 A1 | 3/2002 | De et al. | |
| 2002/0031028 A1 | 3/2002 | Forbes et al. | |
| 2002/0033730 A1 | 3/2002 | Yao et al. | |
| 2002/0044076 A1 | 4/2002 | Yao et al. | |
| 2002/0079951 A1 | 6/2002 | Borkar et al. | |
| 2002/0118569 A1 | 8/2002 | Jeong et al. | |
| 2002/0140496 A1 | 10/2002 | Keshavarzi et al. | |
| 2002/0155671 A1 | 10/2002 | Lukes et al. | |
| 2002/0163377 A1 | 11/2002 | Bruneau et al. | |
| 2002/0171461 A1 | 11/2002 | Yamazaki et al. | |
| 2002/0171468 A1 | 11/2002 | Bryant et al. | |
| 2002/0179876 A1 | 12/2002 | Pang et al. | |
| 2003/0001633 A1 | 1/2003 | Gresham | |
| 2003/0001663 A1 | 1/2003 | Zhang | |
| 2003/0005378 A1 | 1/2003 | Tschanz et al. | |
| 2003/0016078 A1 | 1/2003 | Hinterscher | |
| 2003/0038668 A1 | 2/2003 | Zhang et al. | |
| 2003/0053335 A1 | 3/2003 | Hart et al. | |
| 2003/0067042 A1 | 4/2003 | Kaatz | |
| 2003/0080802 A1 | 5/2003 | Ono et al. | |
| 2003/0141929 A1 | 7/2003 | Casper et al. | |
| 2003/0151428 A1 | 8/2003 | OuYang | |
| 2003/0208611 A1 | 11/2003 | Weber et al. | |
| 2003/0209752 A1 | 11/2003 | Cai et al. | |
| 2003/0218478 A1 | 11/2003 | Sani et al. | |
| 2004/0016977 A1 | 1/2004 | Miyazaki et al. | |
| 2004/0123170 A1 | 6/2004 | Tschanz et al. | |
| 2005/0036346 A1 | 2/2005 | Kim et al. | |
| 2005/0231274 A1 | 10/2005 | Wu | |
| 2005/0258862 A1 | 11/2005 | Rahim et al. | |
| 2005/0280437 A1 | 12/2005 | Lewis et al. | |
| 2006/0038605 A1 | 2/2006 | Pineda De Gyves et al. | |
| 2006/0019382 A1 | 6/2006 | Shumarayev et al. | |
| 2006/0119382 A1 | 6/2006 | Shumarayev et al. | |

OTHER PUBLICATIONS

U.S. Appl. No. 11/420,737, filed May 27, 2006.
"Challenges For Low-Power And High-Performance Chips", IEEE Design & Test Of Computers, Jul.-Sep. 1998, pp. 119-124.
Kawaguchi et al., "Dynamic Leakage Cut-Off Scheme For Low-Voltage SRAM's", IEEE, Symposium On VLSI Circuits Digest Of Technical Papers, 1998, pp. 140-141.
Nose et al., "Voltage Dependant Gate Capacitance And Its Impact In Estimating Power And Delay of CMOS Digital Circuits With Low Supply Voltage", ISLPED, 2000, pp. 228-230.
Zyuban et al., "Low Power Integrated Scan-Retention Mechanism", ISLPED, Aug. 12-14, 2002, pp. 98-102.
Das et al., "Ultra Low-Leakage Power Strategies For Sub-1 V VLSI:Novel Circuit Styles And Design Methodologies For Partially Depleted Silicon-On-Insulator (PD-SOI) CMOS Technology", 16th International Conference on VLSI Design, 2003, 6 pgs.
Yeap, "Leakage Current In Low Standby Power And High Performance Devices: Trends And Challenges", ISPD, Apr. 7-10, 2002, pp. 22-27.
Huang et al., "Scalability And Biasing Strategy For CMOS With Active Well Bias", Abstract *Only, Symposium On VLSI Technology*, 2001, 1 pg.
Kawaguchi et al., "FP 12.4: A CMOS Scheme For 0.5V Supply Voltage With Pico-Ampere Standby Current", IEEE, 1998, pp. 12.4-1 to 12.4-10.
Heo et al., "Dynamic Fine-Grain Leakage Reduction Using Leakage -Biased Bitlines", 29th Annual International Symposium For Computer Architecture (ISCA-29), May 2002, 11 pgs.
Kosonocky et al., "Enhanced Multi-Threshold (MTCMOS) Circuits Using Variable Well Bias", ISLPED, Aug. 6-7, 2001, pp. 165-169.
Kim et al., "Dynamic VTH Scaling Scheme For Active Leakage Power Reduction", Design, Automation And Test In Europe Conference And Exhibition, Mar. 2005, 5 pgs.
Gayasen et al., "Reducing Leakage Energy In FPGAs Using Region-Constrained Placement", FPGA, Feb. 22-24, 2004, 8 pgs.
Chen et al., "Low-Power Technology Mapping for FPGA Architectures With Dual Supply Voltage", FPGA, Feb. 22-24, 2004, 9 pgs.
Li et al., "Low-Power FPGA Using Pre-defined Dual-Vdd/Dual-Vt Fabrics", FPGA, Feb. 22-24, 2004, 9 pgs.
Anderson et al., "Active Leakage Power Optimization For FPGAs", FPGA, Feb. 22-24, 2004, pp. 34-41.
Kosonocky et al., "Low-Power Circuits And Technology For Wireless Digital Systems", IBM J. Res. & Dev., vol. 47, No. 2/3, Mar./May 2003, pp. 283-298.
Sakurai, "Low Power Design Of Digital Circuits", pp. 1-5, no date.
Sakurai, "Recent Topics For Realizing Low-Power, High-Speed VSLIs", 6 pgs, no date.
Sakurai, "Recent Topics For Realizing Low-Power, High-Speed VSLIs", Workshop on Advanced CMOS, Oct. 31, 2001, 24 pgs.
Heo et al., "Leakage-Biased Domino Circuits For Dynamic Fine-Grain Leakage Reduction", Symposium On VLSI Circuits, June 2002, 4 pgs.
Tschanz et al., "Dynamic Sleep Transistor And Body Bias For Active Leakage Power Control Of Microprocessors", IEEE Journal Of Solid-State Circuits, vol. 38, No. 11, Nov. 2003, pp. 1838-1845.
Miyazaki et al., "A 1.2-GIPS/W Microprocessor Using Speed-Adaptive Threshold-Voltage CMOS With Forward Bias", IEEE Journal Of Solid-State Circuits, vol. 37, No. 2, Feb. 2002, pp. 210-217.
Tschanz et al., "Adaptive Body Bias For Reducing Impacts Of Die-To-Die And Within-Die Parameter Variations On Microprocessor Frequency And Leakage", IEEE Journal Of Solid-State Circuits, vol. 37, No. 11, Nov. 2002, pp. 1396-1402.
Kuroda et al., "Variable Supply-Voltage Scheme For Low-Power High-Speed CMOS Digital Design", IEEE Journal Of Solid-State Circuits, vol. 33, No. 3, Mar. 1998, pp. 454-462.
Inukai et al., "Variable Threshold Voltage CMOS (VTCMOS) In Series Connected Circuits", ISPLED, Aug. 6-7, 2001, 7 pgs.
Sakurai, "Low-Power CMOS Design Through $V_{TH}$ Control And Low-Swing Circuits", 1997, pp. 1-6.
Kawaguchi et al., "A Reduced Clock-Swing Flip-Flop (RCSFF) For 63% Clock Power Reduction", Symposium on VLSI Circuits Digest Of Technical Papers, 1997, pp. 97-98.
Kuroda et al., "A 0.9-V, 150-MHz, 10-mW, 4mm$^2$, 2-D Discrete Cosine Transform Core Processor With Variable Threshold-Voltage (VT) Scheme", IEEE Journal Of Solid-State Circuits, vol. 31, No. 11, Nov. 1996, pp. 1770-1779.

Nose et al., "Optimization Of $V_{DD}$ and $V_{Th}$ For Low-Power And High-Speed Applications", Proceedings ASP-DAC, 2000, 6 pgs.

Kawaguchi et al., "A Super Cut-Off CMOS (SCCMOS) Scheme For 0.5-V Supply Voltage With Picoampere Stand-By Current", IEEE Journal Of Solid-State Circuits, vol. 35, No. 10, Oct. 2000, pp. 1498-1501.

Nose et al., "$V_{TH}$-Hopping Scheme To Reduce Subthreshold Leakage For Low-Power Processors", IEEE Journal Of Solid-State Circuits, vol. 37, No. 3, Mar. 2002, pp. 413-419.

Nose et al., "$V_{TH}$-Hopping Scheme For 82% Power Saving In Low-Voltage Processors", IEEE, 2001, 4 pgs.

Kuroda et al., "Substrate Noise Influence On Circuit Performance In Variable Threshold-Voltage Scheme", ISLPED, 1996, 6 pgs.

Kuroda et al., "A 0.9-V, 150-MHz, 10-mW, 4mm$^2$, 2-D Discrete Cosine Transform Core Processor With Variable Threshold-Voltage Scheme", IEEE International Solid-State Circuits Conference, Technical Papers, 1996, 14 pgs.

Anderson et al., "A Novel Low-Power FPGA Routing Switch", IEEE Custom Integrated Circuits Conference, 2004, 4 pgs.

Anderson et al., "Low-Power Programmable Routing Circuitry For FPGAs", 8 pgs, no date.

Inukai et al. "Variable Threshold Voltage CMOS In Series Connected Circuits", 29 pgs, no date.

Roy, "Leakage: Estimation And Circuit Design Technique For Nano-Scale Technologies", 102 pgs, no date.

Kuroda et al., "Overview of Low-Power ULSI Circuit Technique", IEICE Trans. Electron., vol. E78-C, No. 4, Apr. 1995, 12 pgs.

Robenson, "Investigation Of A Dynamic Threshold Voltage Control Via Body Bulk-Biasing As A Forth Terminal On A CMOS Process Technology", University of Florida, Journal Of Undergraduate Research, http://web.clas.ufl.edu/CLAS/jur/0603/robensonpaper.html, Jun. 2003, 8 pgs.

Kobayashi et al, "Self-Adjusting Threshold-Voltage Scheme (SATS) For Low-Voltage High-Speed Operation", IEEE Custom Integrated Circuits Conference, May 1994, 5 pgs.

Burr et al, "A 200mV Self-Testing Encoder/Decoder Using Stanford Ultra-Lower-Power CMOS", IEEE International Solid-State Circuits Conference, Digest Of Technical Papers, 1994, 3 pgs.

Hamada et al., "Utilizing Surplus Timing For Power Reduction", IEEE Custom Integrated Circuits Conference, 2001, pp. 89-92.

Kuroda, "Design With Multiple $V_{DD}$ Planes", ISSCC Workshop on Microprocessors, Feb. 2003, 36 pgs.

Kuroda, "CMOS Design Challenges To Power Wall", MNC, 2001, 58 pgs.

Martin et al, "Combined Dynamic Voltage Scaling And Adaptive Body Biasing For Lower Power Microprocessors Under Dynamic Workloads", ICCAD, Nov. 2002, 5 pgs.

Kuroda, "Optimization And Control For $V_{DD}$ And $V_{TH}$ For Low-Power, High-Speed CMOS Design", IEEE, 2002, 7 pgs.

Kuroda, "Low-Power, High-Speed CMOS VLSI Design", IEEE International Conference On Computer Design: VLSI In Computers And Processors, 2002, 6 pgs.

Najm, "State Dependence And Sleep States; Memory/Cache Circuits And Architectures", ICCAD, 2003, 67 pgs.

Anderson et al., "Low-Power Programmable Routing Circuitry For FPGAs", IEEE, 2004, 8 pgs.

Borkar et al., "Parameter Variations And Impact On Circuits And Microarchitecture", Circuit Research, Intel Labs, 14 pgs, no date.

Narendra et al., "Forward Body Bias For Microprocessors In 130-nm Technology Generation And Beyond", IEEE Journal of Solid-State Circuits, vol. 38, No. 5, May 2003, pp. 696-701.

Augsburger et al, "Combining Dual-Supply, Dual Threshold And Transistor Sizing For Power Reduction", 6 pgs, no date.

Kuroda, "Power-Aware Electronics: Challenges And Opportunities Unit 4: Design With Multiple $V_{DD}/V_{TH}$ Planes", FTFC Tutorial, May 14, 2003, 30 pgs.

Kuroda, paper in ISSCC 2002, 54 pages.

Kuroda, "Power-Aware Electronics: Challenges And Opportunities Unit 5: Variable $V_{DD}/V_{TH}$ Design Techniques", FTFC Tutorial, May 14, 2003, 38 pgs.

Kuroda, "10 Tips For Low Power CMOS Design", 40$^{th}$ DAC Tutorial 1 "Design Techniques For Power Reduction", Jun 2, 2003, 72 pgs.

U.S. Appl. No. 11/369,664, filed Mar. 6, 2006, Perisetty.

U.S. Appl. No. 11/369,548, filed Mar. 6, 2006, Perisetty.

* cited by examiner

US 7,355,437 B2

LATCH-UP PREVENTION CIRCUITRY FOR INTEGRATED CIRCUITS WITH TRANSISTOR BODY BIASING

BACKGROUND

This invention relates to preventing latch-up in integrated circuits, and more particularly, to latch-up prevention circuitry for integrated circuits such as programmable logic devices with transistor body biasing circuitry.

The performance of modern integrated circuits is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

Integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors.

NMOS and PMOS integrated circuits have four terminals—a drain, a source, a gate, and a body. The body terminal, which is sometimes referred to as the well or bulk terminal, can be biased to improve transistor performance. For example, a positive bias voltage can be applied to the body of a PMOS transistor and a negative bias voltage can be applied to the body of an NMOS transistor. These bias voltages increase the effective threshold voltages of the transistors and thereby reduce their leakage currents. Reductions in leakage current reduce power consumption.

In commonly-used CMOS integrated circuit transistor structures, doped semiconductor regions form a pair of parasitic bipolar transistors. The presence of the parasitic bipolar transistors makes the CMOS transistors susceptible to an undesirable phenomenon called latch-up. During a latch-up event, feedback paths are created in the parasitic bipolar transistors that cause the CMOS transistors to function improperly. In severe situations, latch-up can permanently damage the CMOS transistors. Latch-up problems are particularly serious in integrated circuits using body biasing.

One way to prevent latch-up in a CMOS integrated circuit is to place power-up restrictions on users of the integrated circuit. These power-up restrictions dictate the order in which various voltage supply pins on the integrated circuit can receive signals. By designing systems to strictly follow the power-up rules, designers can be assured that the integrated circuit will not exhibit latch-up.

It is not always acceptable to place power-up restrictions on a system designer. In certain applications, it is desirable to allow an integrated circuit to be removed from a system and reinserted in a system without restriction. The process of swapping an integrated circuit or a component in which an integrated circuit is used in and out of a system is sometimes referred to as hot socketing. Hot-socket compatibility is highly desirable for applications in which a device needs to be moved between systems or used intermittently, but can lead to violations of power-up restrictions.

When a device is inserted into a system, electrical connections are formed between pins on the device and pins in the system. With commonly-used connectors, it is not possible to ensure the order in which the various pins will contact each other. As a result, the order in which the voltage supply pins on the integrated circuit receive signals from the system is not known in advance and cannot be controlled. If a user happens to insert a device into a socket in a way that causes the voltage supply pins to form connections in an inappropriate order, the integrated circuit may experience latch-up.

It would therefore be desirable to provide latch-up prevention capabilities for integrated circuits with transistor body biasing such as such as programmable logic device integrated circuits.

SUMMARY

In accordance with the present invention, an integrated circuit such as a programmable logic device integrated circuit is provided that contains latch-up prevention circuitry for preventing latch-up in body-biased metal-oxide-semiconductor transistors. The integrated circuit contains n-channel metal-oxide-semiconductor transistors and p-channel metal-oxide-semiconductor transistors. The transistors each have a body terminal. Body bias paths are used to distribute body bias signals to the body terminals of the transistors. The body bias signals increase the threshold voltages of the transistors and reduce leakage current.

A body bias signal can be applied to a body bias path from an external source such as a voltage regulator that is external to the integrated circuit. If desired, body bias generation circuitry may be provided on the integrated circuit to generate a body bias signal internally. The body bias generation circuitry may be powered using a power supply signal such as an elevated power supply signal that is otherwise used to power peripheral circuitry on the integrated circuit. Core logic on the integrated circuit may be powered using a core logic power supply signal that is smaller than the elevated power supply signal. With one suitable arrangement, the elevated power supply signal is about 2.5 volts and the core logic positive power supply signal is 1.1 volts. A ground signal of 0 volts is also used as a power supply signal.

A potential for latch-up can arise if the positive power supply voltage and ground signal become valid while a body bias signal is not valid. This can occur, for example, when a device in which the integrated circuit is contained is inserted in a particular way into a socket whose pins supply power to the integrated circuit. The order in which various power supply pins and paths on the integrated circuit receive their intended signals depends on the way in which the pins of the device make contact with the socket pins.

In some situations, an externally-supplied body bias signal or an internally-generated body bias signal may become present on a body bias path before the core logic power supply signal and ground power supply signal are available. In this scenario, because the body bias signal has become valid before the core logic power supply signal and ground signal, the transistors will not latch-up when the rest of the integrated circuit powers up. In other situations, a body bias signal may not become valid until the core logic power supply and ground voltage have already become valid. This creates a potential latch-up condition for the metal-oxide-semiconductor transistors.

The active latch-up prevention circuitry monitors the power supply signals such as the core logic positive power supply signal, the ground power supply signal, the elevated power supply signal, and power supply signals that are derived from these signals, are precursors to these signals, or are otherwise associated with these signals. If a potential latch-up condition is detected, the latch-up prevention circuitry holds each body bias path at a safe voltage to prevent latch-up in the metal-oxide-semiconductor transistors. Suitable safe voltages include the core logic positive power supply signal level (e.g., 1.1 volts) for PMOS body bias paths and ground (e.g., 0 volts) for NMOS body bias paths. The latch-up prevention circuitry holds the body bias paths at safe voltages such as these while the potential latch-up conditions are present. When all of the power supply signals have become valid, there is no danger of latch-up, so the active latch-up prevention circuitry releases the body bias paths and allows them to be biased at desired body bias signal levels.

Further features of the invention, its nature and various advantages will be more apparent from the accompanying drawings and the following detailed description.

DETAILED DESCRIPTION

The present invention relates to body-biased integrated circuits with latch-up prevention circuitry. The integrated circuits may be of any suitable type. With one particularly suitable arrangement, latch-up prevention circuitry in accordance with the invention is used on a programmable logic device integrated circuit. The latch-up prevention circuitry can also be used on integrated circuits such as digital signal processors, microprocessors, custom integrated circuits, or any other integrated circuit with body biasing that is susceptible to latch-up events. The present invention is generally described in the context of programmable logic device integrated circuits as an example.

Programmable logic device integrated circuits can be customized using configuration data. In a typical scenario, a logic designer uses a computer-aided design (CAD) system in designing a desired logic circuit. The computer-aided design system uses information on the hardware capabilities of a programmable logic device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, the programmable elements are based on random-access memory (RAM) cells.

To customize programmable logic devices to implement the desired logic circuit, the configuration data produced by the computer-aided design system is loaded into the programmable memory elements. During operation of the programmable logic device, each memory element provides a static output signal based on its loaded configuration data. The outputs signals from the memory elements are applied to the gates of metal-oxide-semiconductor transistors in regions of programmable logic on the programmable logic device. This configures the programmable logic so that the programmable logic device implements the desired logic circuit.

The programmable logic and other circuitry on the programmable logic device is formed from n-channel metal-oxide-semiconductor field-effect transistors (NMOS transistors) and p-channel metal-oxide-semiconductor field-effect transistors (PMOS transistors). Integrated circuits with NMOS and PMOS transistors are referred to as complementary metal-oxide-semiconductor (CMOS) integrated circuits.

To reduce power consumption, at least some of the transistors are provided with body biases. For example, NMOS transistors may be provided a body bias voltage that is slightly lower than ground and PMOS transistors may be provided with body bias that is slightly larger than their positive power supply voltage. The body bias voltages reduce transistor leakage and thereby improve device performance.

Figure 1:
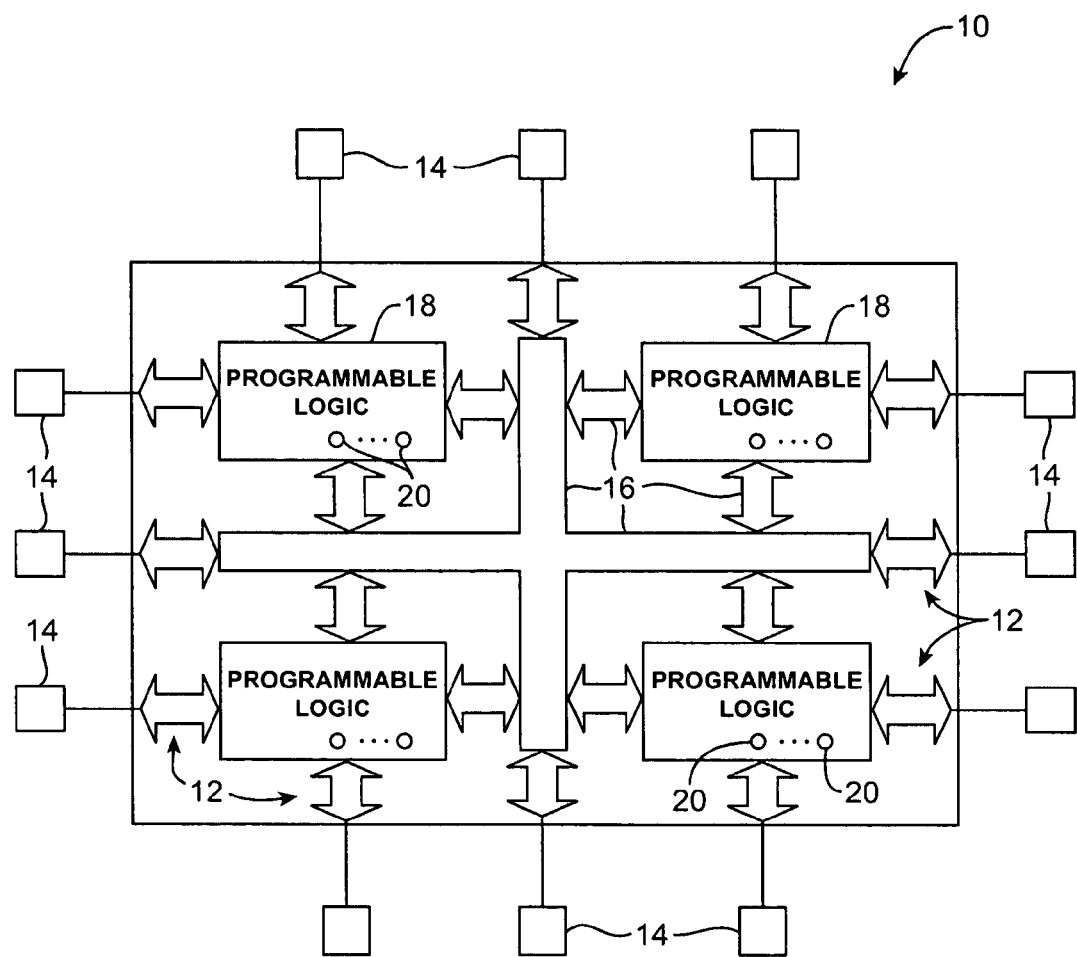
FIG. 1 is a diagram of an illustrative programmable logic device integrated circuit in accordance with the present invention.

An illustrative programmable logic device 10 in accordance with the present invention is shown in FIG. 1. Programmable logic device 10 is preferably hot socket compatible. Programmable logic device 10 has input-output circuitry 12 for driving signals off of device 10 and for receiving signals from other devices via input-output pins 14. Interconnection resources 16 such as global and local vertical and horizontal conductive lines and busses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 18.

The programmable elements 20 in logic 18 may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The primary processing circuitry of integrated circuits such as integrated circuit 10 of FIG. 1 is located in the central region of the device. Input-output circuitry 12 is typically located around the periphery of the integrated circuit. The central region of the device is sometimes referred to as the core of the device and the circuitry in that region is sometimes referred to as core circuitry or core logic. Many integrated circuits use multi-level power supply schemes in which core circuitry is powered using a relatively low power supply level and input-output predriver circuits and other peripheral components are powered using one or more elevated supply levels. The core logic power supply level is sometimes referred to as Vcc-core or Vcc. One of the elevated power supply levels that may be used for powering peripheral circuitry is sometimes referred to as Vccpd. Other power supply levels may also be used. The voltage Vss is generally referred to as ground.

Any suitable number of different power supply levels may be used to power device 10. An integrated circuit 10 that is powered using an elevated power supply level Vccpd of 2.5 volts, a positive core logic power supply voltage of 1.1 volts, and a ground voltage Vss of 0 volts is described herein as an example. This power supply configuration is merely illustrative. Other suitable power supply voltages may be used to power the integrated circuit 10 if desired.

The transistors on device 10 have four terminals—a source, a drain, a gate, and a body. The gate terminal of a transistor is its control terminal. The voltage on a transistor's gate helps to regulate the amount of current flowing between its drain and source. The body terminal, which is also sometimes referred to as a well terminal or a bulk terminal, is connected to a semiconductor region called a well in which the drain and source are formed.

Body biasing schemes reduce power consumption by applying bias voltages to the body terminals of the transistors on an integrated circuit. In p-channel metal-oxide-semiconductor transistors, the voltage of the body terminal can be elevated slightly with respect to the positive power supply voltage Vcc. In n-channel metal-oxide-semiconductor transistors, the body terminal voltage can be lowered somewhat relative to ground Vss.

For example, the body terminal of an n-channel metal-oxide-semiconductor transistor can be biased at a negative voltage having a magnitude in the range of about 300 mV, compared to a ground voltage Vss of 0 volts. The body of a p-channel metal-oxide-semiconductor transistor can be biased at 1.6 volts (as an example) or in the range of 1.1 V to 2.1 volts (as an example). A body bias of 1.6 volts is 500 mV higher than Vcc (which is 1.1 volts in this example). Excessive body bias levels are generally avoided, because large amounts of body bias can reduce device performance (e.g., switching speed).

Body biases can be provided using any suitable body bias source. For example, a body bias can be provided using an external source such as an external voltage regulator. Internal biasing schemes in which body bias voltages are generated on chip may also be used.

Figure 2:
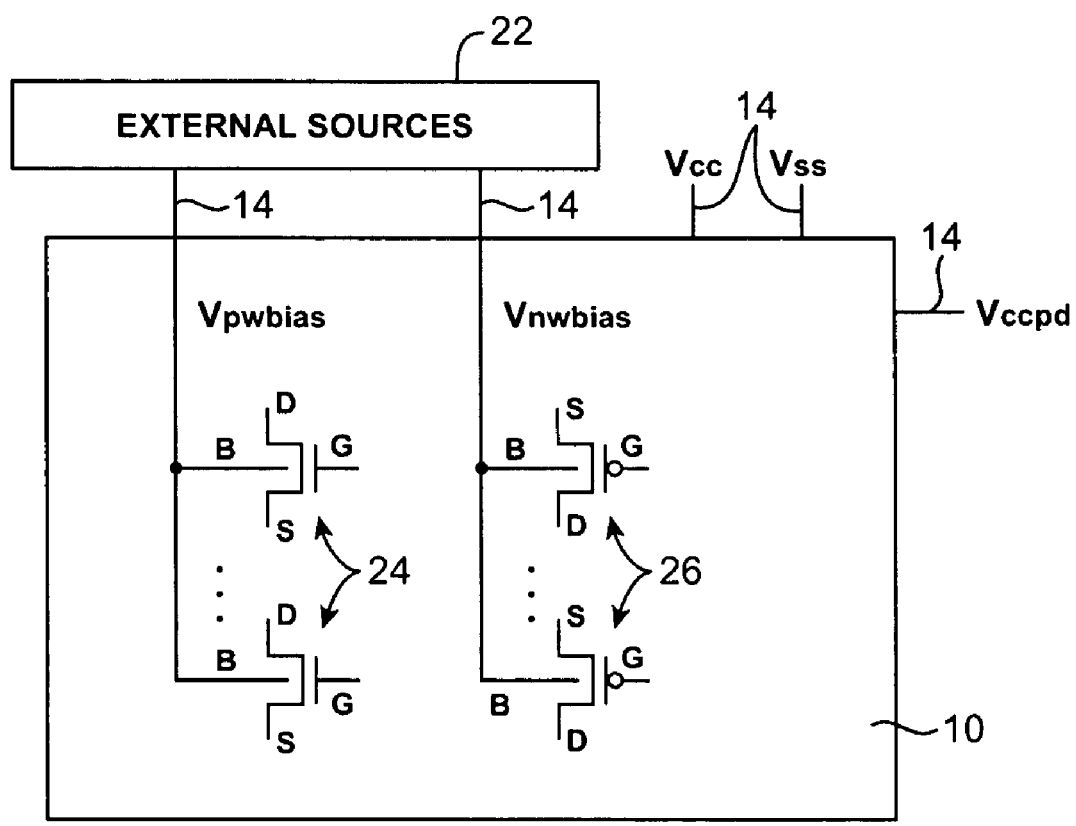
FIG. 2 is a schematic diagram of an integrated circuit with transistors that receive body biases from external sources in accordance with the present invention.

A schematic diagram of an illustrative external biasing arrangement is shown in FIG. 2. External body bias sources 22 are connected to pins 14 of integrated circuit 10. Pins 14 are also used to receive power supply voltages Vcc, Vss, and Vccpd. The external sources 22 may be, for example, voltage regulator circuits that are contained on a system board or other mounting structure. Integrated circuit 10 may be connected to external sources using a pin-and-socket connector or any other suitable connector. Integrated circuit 10 includes NMOS transistors 24 and PMOS transistors 26. The sources of transistors 24 and 26 are labeled S, the drains are labeled D, the gates are labeled G, and the body terminals are labeled B. As shown in FIG. 2, a body bias voltage Vpwbias is applied to body terminal B of each NMOS transistor 24. A body bias voltage Vnwbias is applied to body terminal B of each PMOS transistor 26. Illustrative values of Vpwbias and Vnwbias are −0.3 volts and 1.6 volts.

In the example of FIG. 2, a single value of Vpwbias is used to body bias transistors 24 and a single value of Vnwbias is used to body bias transistors 26. This is merely illustrative. For example, there may be two or more different values of Vpwbias (e.g., Vpwbias1, Vpwbias2, etc.) and there may be two or more different values of Vnwbias (e.g., Vnwbias1, Vnwbias2, etc.). These different body bias values may be distributed to different corresponding groups of transistors. If desired, control circuitry on the integrated circuit or associated with external sources 22 may be used to selectively generate the body bias voltages so that device 10 exhibits an optimum balance between power consumption and performance.

Figure 3:
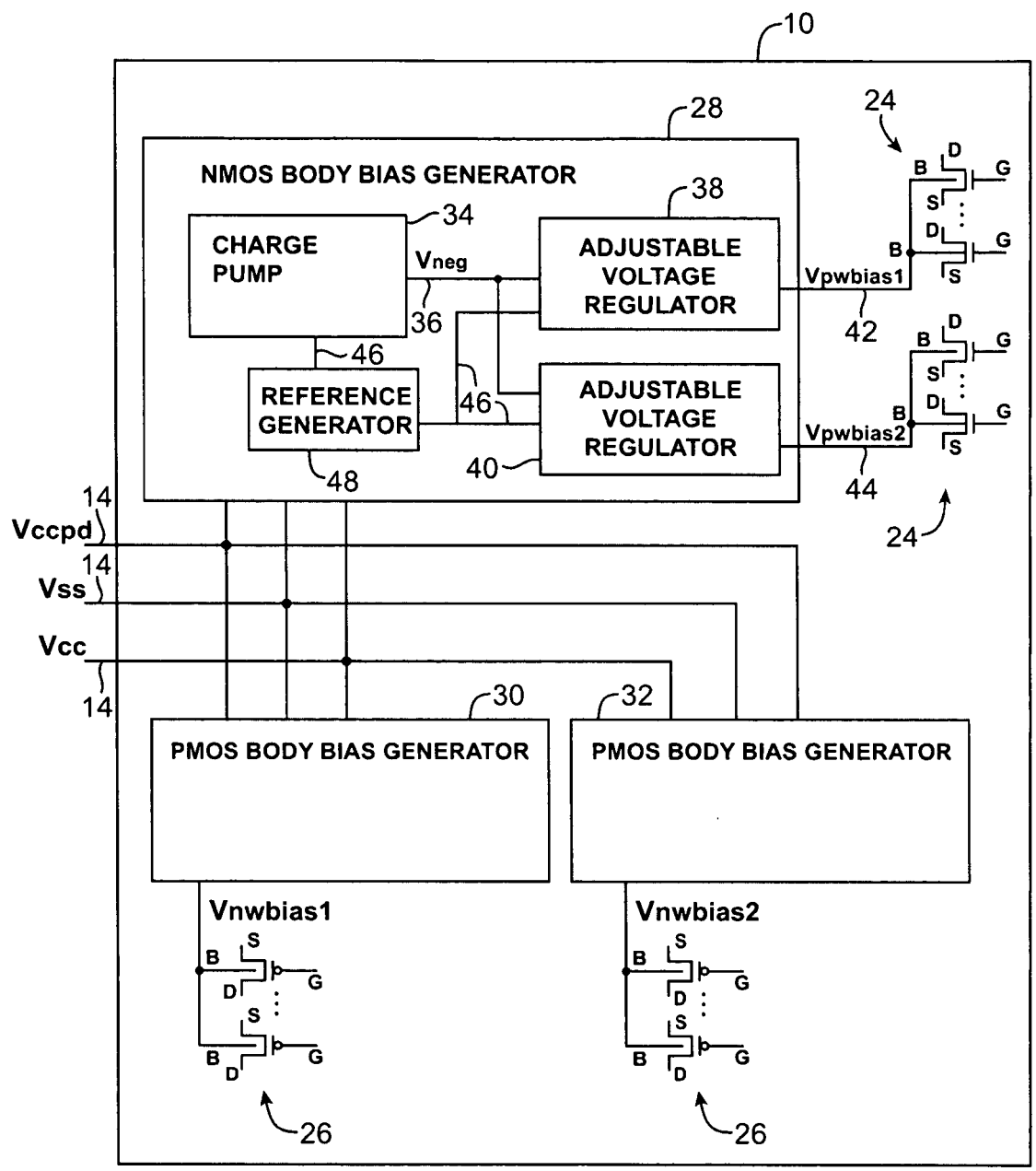
FIG. 3 is a schematic diagram of an integrated circuit with transistors that receive body biases from internal sources in accordance with the present invention.

A schematic diagram of an illustrative integrated circuit 10 using internal body biasing circuitry is shown in FIG. 3. Pins 14 are used to receive power supply voltages Vcc, Vss, and Vccpd. In the example of FIG. 3, two different values of Vpwbias (Vpwbias1 and Vpwbias2) are generated as body biases for two associated groups of NMOS transistors 24. Two different values of Vnwbias (Vnwbias1 and Vnwbias2) are generated as body biases for two associated groups of PMOS transistors 24. NMOS body bias generator 28 generates body bias voltages Vpwbias1 and Vpwbias2. PMOS body bias generator 30 generates Vnwbias1. PMOS body bias generator 32 generates Vnwbias2.

There are four different body bias voltages generated in the example of FIG. 3. This is merely illustrative. For example, there may be a single value of PMOS transistor body bias or more than two values of PMOS transistor body bias. Similarly, there may be a single value of NMOS transistor body bias or more than two values of NMOS transistor body bias. Control circuitry on the integrated circuit 10 may be used to selectively control which body bias voltages are generated (e.g., to optimize the operation of circuit 10) or the body bias voltage arrangement may be used to produce fixed body bias voltages.

Any suitable power supply arrangement may be used to power on-chip generators such as generators 28, 30, and 32. In the example of FIG. 3, PMOS body bias generator circuitry 30 and 32 and NMOS power supply generator 28 are powered using core power supply voltage Vcc, elevated power supply voltage Vccpd, and ground voltage Vss. In general, internal body bias generation schemes attempt to minimize use of power supply pins and therefore are preferably operated using power supply voltages that would otherwise be made available on integrated circuit 10. If desired, however, one or more additional positive or negative power supply voltages may be used. The arrangement of FIG. 3 is merely illustrative.

Any suitable circuitry may be used for NMOS body bias generator 28. In the example of FIG. 3, NMOS body bias generator 28 has adjustable voltage regulators 38 and 40, which supply body bias voltages Vpwbias1 and Vpwbias2 at outputs 42 and 44, respectively. The magnitudes of the body bias voltages Vpwbias1 and Vpwbias2 may be adjusted by adjusting regulators 38 and 40 (e.g., using internal control signals provided by programmable elements 20, using dynamically-generated internal control signals, or using external control signals). The voltages Vpwbias1 and Vpwbias2 are negative (less than Vss). If desired, regulators 38 and 40 may be fixed regulators rather than adjustable regulators.

A reference generator 48 may be used to supply reference currents and voltages. Reference signals may be distributed using paths 46.

A charge pump 34 may be used to generate a negative power supply voltage Vneg. The voltage Vneg is distributed to adjustable voltage regulators 38 and 40 over path 36. With one suitable arrangement, the value of Vneg is about −1.0 volt, which is larger in magnitude than the largest negative body bias voltage required to produce the signals Vpwbias1 and Vpwbias2. Regulators 38 and 40 reduce the magnitude of Vneg to produce desired values of Vpwbias1 and Vpwbias2.

Figure 4:
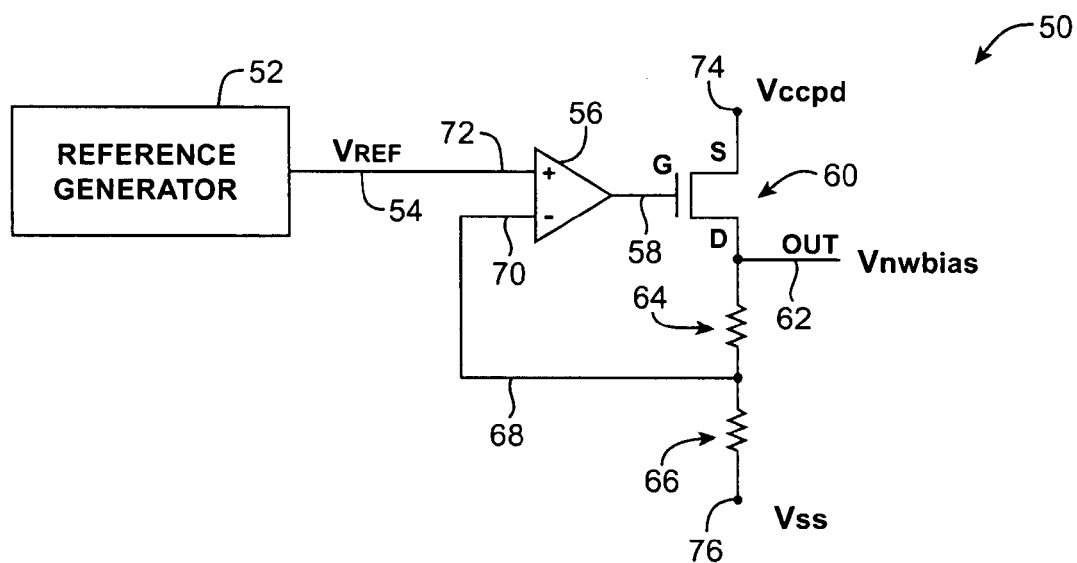
FIG. 4 is a schematic diagram of illustrative p-channel metal-oxide-semiconductor transistor body bias circuitry in accordance with the present invention.

An illustrative PMOS body bias generation circuit 50 is shown in FIG. 4. Reference generator 50 produces a voltage reference signal Vref (e.g., 0.5 volts) on line 54. Operational amplifier 56 has two inputs 72 and 70 and an output 58. The voltage on output 58 controls the gate G of transistor 60. Transistor 60 has its source S connected to Vccpd terminal 74. Series-connected resistors 64 and 66 form a voltage divider and are connected between the drain D of transistor 60 and a source of ground potential Vss at terminal 76. The output terminal 62 of circuit 50 produces the body bias voltage Vnwbias. The set point of PMOS body bias generation circuit 50 is established by the values of Vref and the values of resistors 64 and 66.

The ratio of the resistances of resistors 64 and 66 is selected so that in steady state, when the desired value of Vnwbias is being produced at output terminal 62, the voltage on feedback path 68 is equal to the value of Vref. During operation, operational amplifier 56 compares the inputs 70 and 72 and generates a corresponding output signal on output 58. When the value of Vnwbias is larger than its set point value, the operational amplifier output goes low, which increases the drain-source resistance of transistor 60 and reduces the value of Vnwbias at terminal 62. When the value of Vnwbias is smaller than its set point value, the operational amplifier output goes high, which decreases the drain-source resistance of transistor 60 and increases the value of Vnwbias at terminal 62. Using this feedback arrangement, a stable body bias voltage Vnwbias is produced at terminal 62.

The circuit 50 of FIG. 4 may be fixed or may be adjustable. Adjustability may be provided using adjustable voltage divider circuit for resistors 64 and 66. With this type of arrangement, the outputs of programmable elements 20, internally-generated control signals from programmable logic 18, or externally-supplied control signals may be used to control associated transistors. The transistors may be used to establish the setting of the voltage divider circuit and therefore the value of the feedback voltage on line 68. The output on terminal 62 is controlled by adjusting the fraction of the output voltage that is fed back to the comparator input 70 on feedback line 68 while holding reference voltage 54 constant.

As the examples of FIGS. 2, 3, and 4 demonstrate, the states of the body bias signals are dependent on the states of the power supply voltages at pins 14. Integrated circuit 10 is hot-socket compatible, so a user of a device in which integrated circuit 10 is being used is free to connect or disconnect the device 10 from its sources of power. A user may, for example, pull a device containing integrated circuit 10 from one socket and insert it into another socket. As the power supply pins 14 that supply power signals Vcc, Vss, and Vccpd make contact, signals Vcc, Vss, and Vccpd are established and made valid in a particular order.

For example, if the user inserts the device in one way, the signal Vcc may be made valid first (i.e., when a conductor in a socket that is carrying Vcc makes an electrical connection to the Vcc pin on integrated circuit 10). If the user inserts the same device in a slightly different way, the signal Vccpd may be made valid first (i.e., when a conductor in the socket that is carrying Vccpd makes an electrical connection to the Vccpd pin on integrated circuit 10). In certain situations, the sequence of power supply signals that is applied to the integrated circuit 10 has the potential to cause a latch-up condition. When this particular power-up sequence occurs, the integrated circuit 10 has the potential to become damaged or inoperable.

Figure 5:
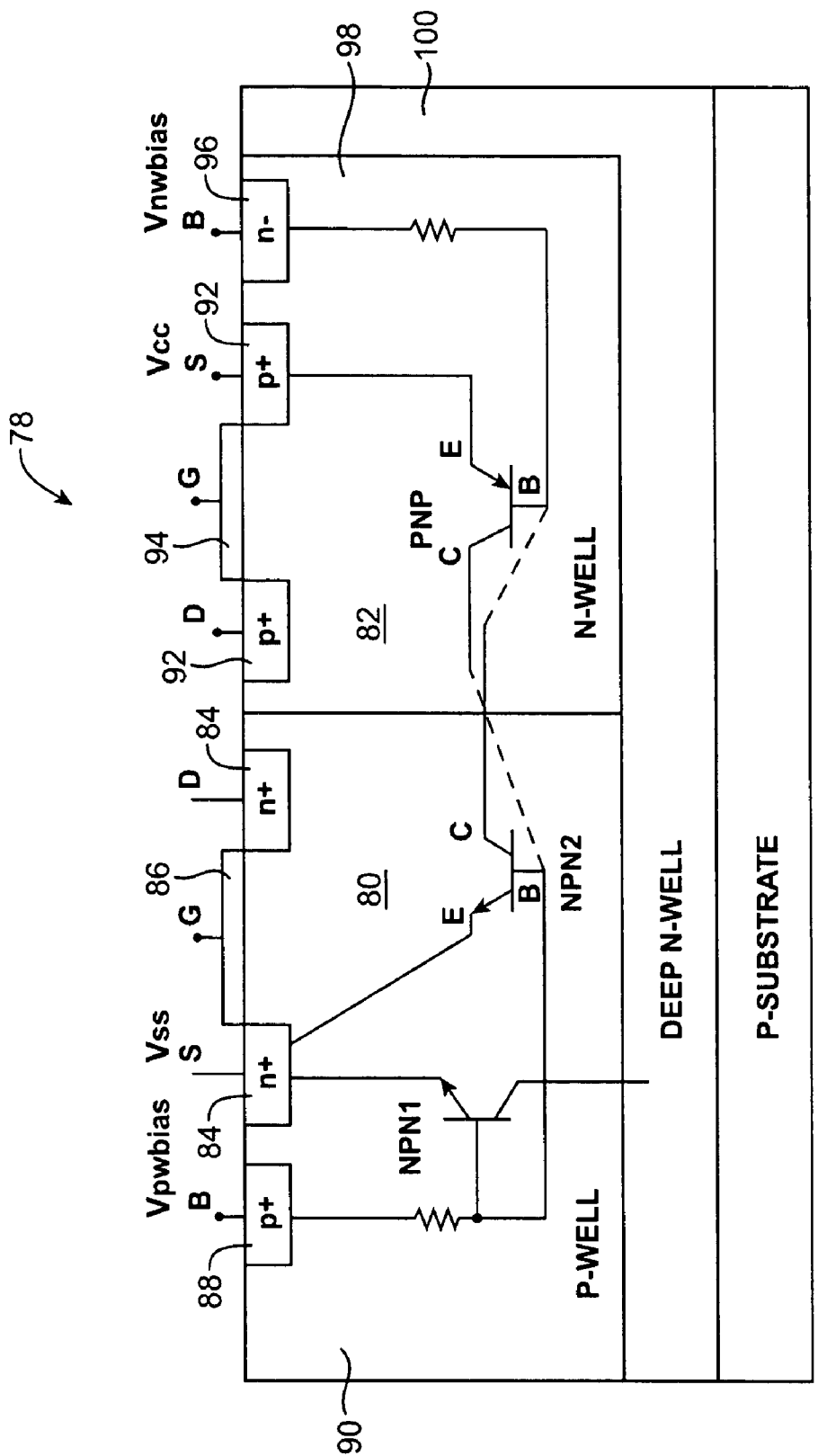
FIG. 5 is cross-sectional side view of an illustrative complementary metal-oxide-semiconductor transistor structure showing the locations of parasitic bipolar transistors that can lead to latch-up conditions under certain biasing conditions.

The latch-up phenomena is due to the presence of parasitic bipolar transistors in the CMOS transistors structures on integrated circuit 10. A cross-section of a typical (triple-well) CMOS transistor structure 78 on integrated circuit 10 is shown in FIG. 5. CMOS structure 78 has an NMOS transistor 80 and a PMOS transistor 82.

In transistor 80, source S and drain D are formed using implant regions 84. Gate structure 86 is formed from a thin layer of insulator such as silicon oxide and a gate conductor such as silicided polysilicon. Body terminal B uses implant region 88 to form an ohmic contact with p-type body region 90.

In transistor 82, source S and drain D are formed using implant regions 92. Gate structure 94 is formed from a thin layer of insulator such as silicon oxide and a gate conductor such as silicided polysilicon. Body terminal B uses implant region 96 to form an ohmic contact with n-type body region 98. Deep n-type well 100 surrounds well 90 and well 98.

When transistor 80 is operating normally, a negative body bias Vpwbias is applied to the body terminal B of transistor 80 to increase its effective threshold voltage and thereby reduce power consumption. When transistor 82 is operating normally, a positive body bias Vnwbias is applied to the body terminal B of transistor 82 to increase its threshold voltage and thereby reduce power consumption. The voltages applied to the source, drain, and gate terminals of transistors 80 and 82 depend on the circuit in which they are operating. In typical circuit configurations (e.g., certain inverters), the source S of transistor 80 is at Vss and the source S of transistor 82 is at Vcc. Sources and drains in PMOS and NMOS transistors are generally interchangeable and are sometimes referred to collectively as source-drains or source-drain terminals.

As shown in FIG. 5, the doped semiconductor regions in CMOS structure 78 form parasitic bipolar transistors NPN1, NPN2, and PNP. The heavily doped p+ regions 92 form the emitter of the parasitic bipolar transistor PNP. The heavily doped n+ regions 84 form the emitter of the parasitic bipolar transistor NPN2. Under certain power-up sequences, feedback between the parasitic bipolar transistors NPN1, NPN2, and PNP can cause the CMOS structure 78 to enter an undesirable latch-up state.

In general, if the ground signal Vss is not present, the integrated circuit 10 is not operable. Both latch-up and normal operation require Vss to be present. If Vss is present, there are two possible scenarios—Vcc is applied to the circuitry of the integrated circuit before the body bias voltages Vpwbias and Vnwbias become valid or Vcc is applied to the circuitry of the integrated circuit after the body bias voltages become valid. If the body bias voltages Vpwbias and Vnwbias become valid after Vss and Vcc become valid, conditions suitable for latch-up are present and latch-up may result.

Consider the operation of CMOS transistor structures 78 of FIG. 5 when the body bias voltages Vpwbias and Vnwbias become valid after Vcc and Vss have already become valid. Before the body bias signals are valid, the body terminals B of transistors 80 and 82 are floating. The 1.1 volt signal Vcc on the source of transistor 82 tends to forward bias the emitter-base junction of the parasitic bipolar transistor PNP. With the emitter-base junction of transistor PNP forward biased, the base of transistor PNP is one diode turn-on voltage (0.6 volts) lower in voltage than the emitter. Because Vcc is 1.1 volts in this example, the voltage on the base of the parasitic PNP transistor is about 0.5 volts (i.e., 1.1 V-0.6 V). With the emitter-base junction of the parasitic PNP transistor forward biased, the parasitic PNP transistor turns on, which causes the collector of the parasitic PNP transistor to pull the base of parasitic bipolar transistor NPN2 towards Vcc. As the voltage on the base of transistor NPN2 rises, the base-emitter junction of parasitic bipolar transistor NPN2 becomes forward biased and turns on parasitic bipolar transistors NPN1 and NPN2. With transistors NPN1 and NPN2 on, the base of the PNP transistor is pulled toward Vss, which further turns on the parasitic PNP transistor. Through this feedback mechanism, the parasitic transistors become latched in a state in which an undesirable and potentially damaging large current flows from Vcc to Vss through the parasitic bipolar transistor PNP and the parasitic bipolar transistors NPN1 and NPN2. This undesirable latch-up condition will persist, even if valid values of Vnwbias and Vpwbias are applied to the body terminals of transistors 80 and 82.

In accordance with the present invention, latch-up prevention circuitry is provided on the integrated circuit 10 that detects potentially dangerous power supply conditions and takes actions to prevent latch-up from occurring. The latch-up prevention circuitry can detect when the power supply voltages Vss and Vcc become valid before the body biases Vpwbias and Vnwbias and, when this situation is detected, can clamp the body bias distribution paths at safe voltages. For example, Vpwbias can be clamped at Vss and Vnwbias can be clamped at Vcc until the Vpwbias and Vnwbias signals are valid (either because these bias signals are satisfactorily received from an external source or because the necessary precursor power supply voltages for these bias signals have been satisfactorily received and are able to generate valid bias signals on chip). By momentarily clamping Vpwbias and Vnwbias until the integrated circuit has been fully powered up, latch-up scenarios are avoided. The latch-up prevention circuitry ensures that the integrated circuit is hot socket compatible and makes it unnecessary to place power-up restrictions on the user.

Figure 6:
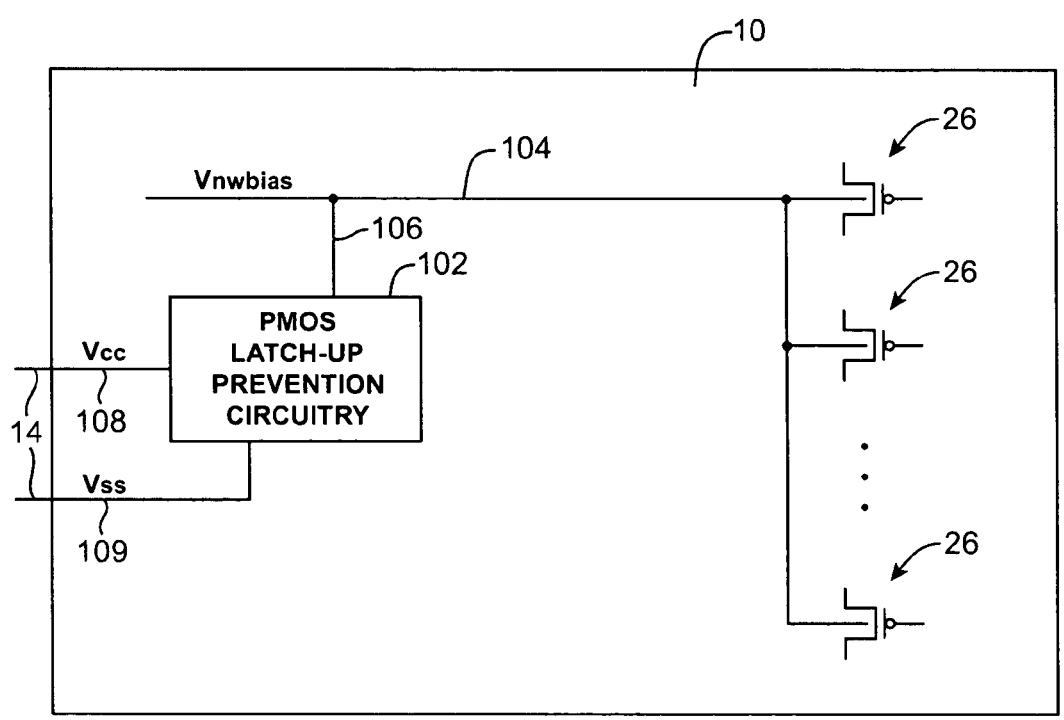
FIG. 6 is a circuit diagram of illustrative circuitry that prevents latch-up in body-biased p-channel metal-oxide-semiconductor transistors in accordance with the present invention.

An illustrative programmable logic device integrated circuit 10 with PMOS latch-up prevention circuitry is shown in FIG. 6. PMOS latch-up prevention circuitry 102 receives positive power supply Vcc and ground power supply Vss from external pins 14 via paths 108 and 109. Line 104 receives body bias signal Vnwbias from an external source 22 (FIG. 2) or an internal source such as body bias generators 30 and 32 of FIG. 3 or body bias generation circuit 50 of FIG. 4. During normal operation of integrated circuit 10, lines such as Vnwbias line 104 are used to distribute the body bias signal Vnwbias to PMOS transistors 26. Any suitable number of body bias signals may be used on circuit 10. Use of a single body bias signal is shown in FIG. 6 as an example.

The PMOS latch-up prevention circuit 102 monitors the signals Vcc and Vss and monitors the signal Vnwbias to determine if a potential latch-up condition exists. When the integrated circuit 10 is powered up (e.g., when a user inserts a device in which integrated circuit 10 is contained into a socket), power supply signals such as Vcc, Vss, and Vnwbias can be applied to lines 108, 109, and 104 in various orders. If PMOS latch-up prevention circuitry 102 determines that the signals Vcc and Vss have become valid before the signal Vnwbias is valid, the PMOS latch-up prevention circuitry 102 can hold the voltage on line 104 at Vcc. Once the signal Vnwbias becomes valid, the PMOS latch-up prevention circuitry 102 can release line 104. This allows the Vnwbias signal to be used for normal body biasing of transistors 26. Because Vnwbias is not allowed to float while Vcc is valid, the latch-up scenario described in connection with FIG. 5 is avoided.

The signals Vcc, Vss, and Vnwbias can be directly monitored by PMOS latch-up prevention circuitry 102 or latch-up prevention circuitry 102 can monitor voltages that are associated with signals Vcc, Vss, and Vnwbias. For example, if a power supply signal is derived from Vcc or if Vcc is derived from another power supply signal, the latch-up prevention circuitry 102 can monitor those signals instead of measuring Vcc. Similarly, if Vnwbias is derived from another power supply voltage or is used in producing another power supply voltage, one of those power supply voltages can be monitored instead of monitoring Vnwbias. Signal monitoring arrangements in which Vcc and Vnwbias are monitored directly are described as an example.

Figure 7:
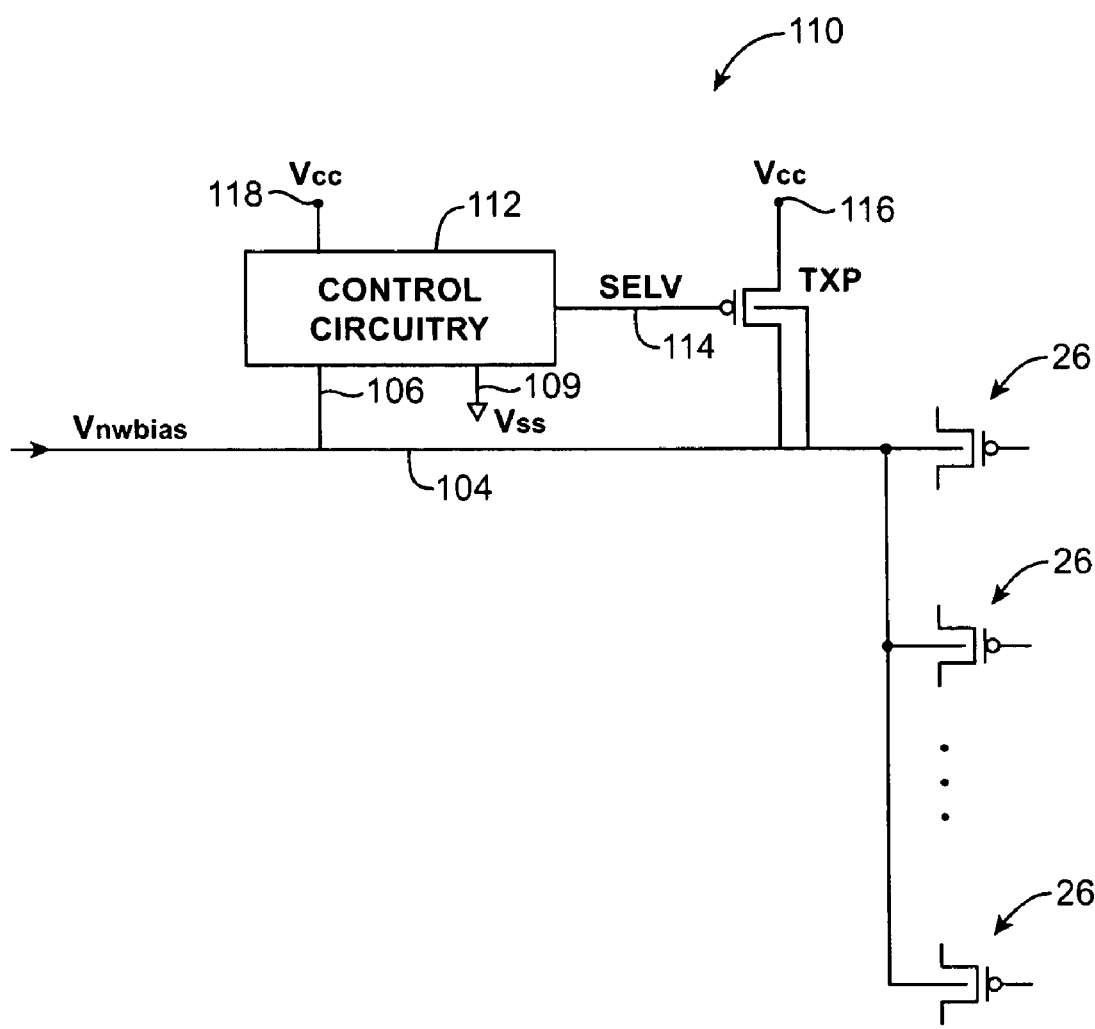
FIG. 7 is a circuit diagram of illustrative latch-up prevention circuitry of the type shown in FIG. 6 in accordance with the present invention.

Illustrative circuitry 110 that may be used for PMOS latch-up prevention circuitry 102 is shown in FIG. 7. As shown in FIG. 7, circuitry 110 includes control circuitry 112 and transistor TXP. The PMOS body bias path 104 is used to distribute the body bias signal Vnwbias to the body terminals of PMOS transistors 26. Control circuitry 112 is electrically connected to path 104 using path 106 and receives ground signal Vss via path 109.

During operation, control circuitry 112 monitors the voltage on path 104 and generates a corresponding control signal SELV at its output. The control signal SELV is applied to the gate of transistor TXP on path 114. One of the drain-source terminals of transistor TXP is connected to power supply terminal 116 and is powered with signal Vcc. The other drain-source terminal of transistor TXP and the body terminal of transistor TXP are connected to path 104.

As shown by terminal 118, control circuitry 112 monitors the status of the signal Vcc. If control circuitry 112 detects that Vcc is valid while Vnwbias is not valid, control circuitry 112 generates a low value of SELV at its output. The low value of SELV turns on transistor TXP and electrically connects terminal 116 to line 104. As long as transistor TXP is on, the voltage on line 104 will remain clamped at Vcc. When control circuitry 112 detects that the Vnwbias signal on line 104 has become valid, control circuitry 112 generates a high value of SELV at its output. The high SELV signal turns off transistor TXP and allows the Vnwbias voltage to be used to body bias transistors 26.

Figure 8:
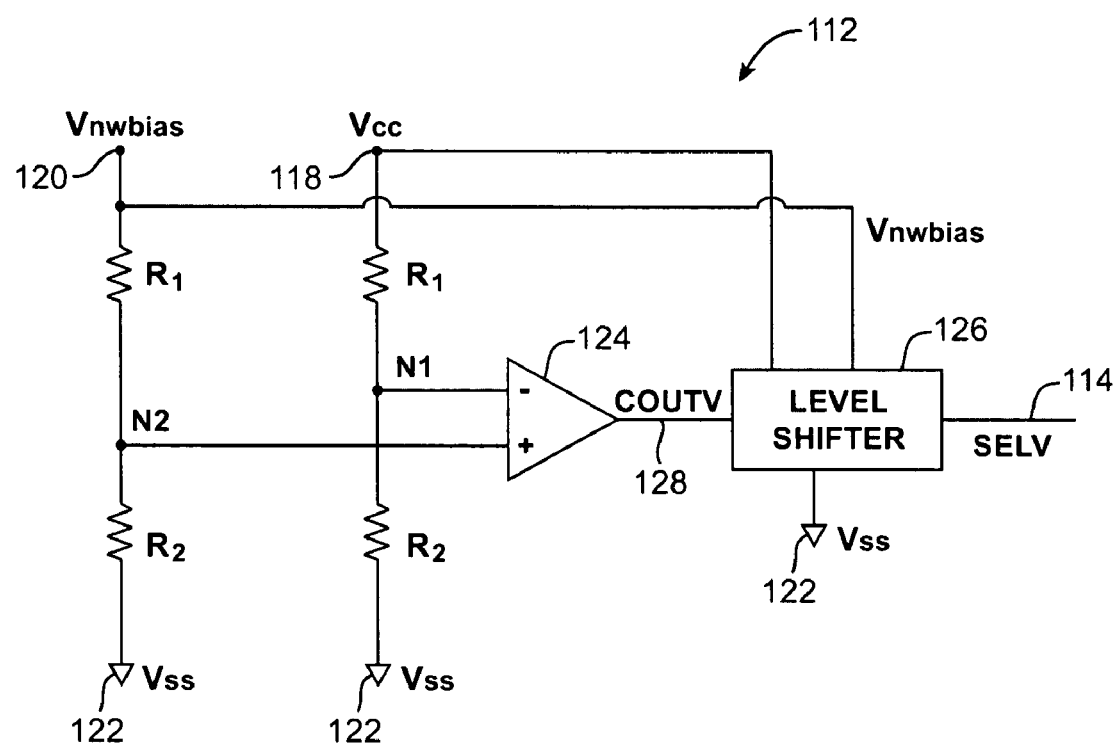
FIG. 8 is a circuit diagram of illustrative control circuitry that may be used in latch-up prevention circuitry of the type shown in FIG. 7 in accordance with the present invention.

Control circuitry 112 can be implemented using any suitable circuit architecture. One suitable arrangement is shown in FIG. 8. The control circuitry 112 of FIG. 8 receives the signal Vnwbias from line 104 (FIGS. 6 and 7) at terminal 120. Signal Vcc is received at terminal 118. Ground signal Vss is received at terminals 122. Control circuitry 112 has a resistor network formed from resistors R1 and R2. The resistors form a pair of voltage dividers. The ratio of the resistances of R1 and R2 is chosen so that appropriate voltage levels are supplied to the positive and negative inputs of comparator 124. For example, values of R1 and R2 may be used that result in a voltage of 0.5 volts being produced at node N1 when Vcc is equal to 1.1 volts. When the voltage at terminal 118 is floating (because Vcc is not yet valid), the voltage at node N1 will be 0 volts (Vss). The voltage divider connected to terminal 120 operates similarly on the signal Vnwbias.

In operation, comparator 124 compares the signals on its inputs and produces a corresponding output signal COUTV on its output. When Vnwbias, Vss, and Vcc are valid, the value of Vnwbias will be larger than or equal to Vcc. In this situation, the voltage on node N2 will be larger than the voltage on node N1 and the signal COUTV will be high. If Vnwbias is not valid (i.e., Vnwbias is not greater than or equal to Vcc), the signal COUTV will be low.

The signal COUTV ranges from a low of Vss to a high of Vcc. To fully turn off transistor TXP (FIG. 7) during normal operation when the signal Vnwbias on line 104 is valid, the COUTV signal on line 128 is level shifted using level shifter 126. The resulting level-shifted version of the signal COUTV is provided as control signal SELV on line 114. When COUTV is at Vss, the signal SELV is at Vss. When COUTV is at Vcc, the signal SELV is at Vnwbias (e.g., 1.6 volts), which is greater than or equal to Vcc.

Figure 9:
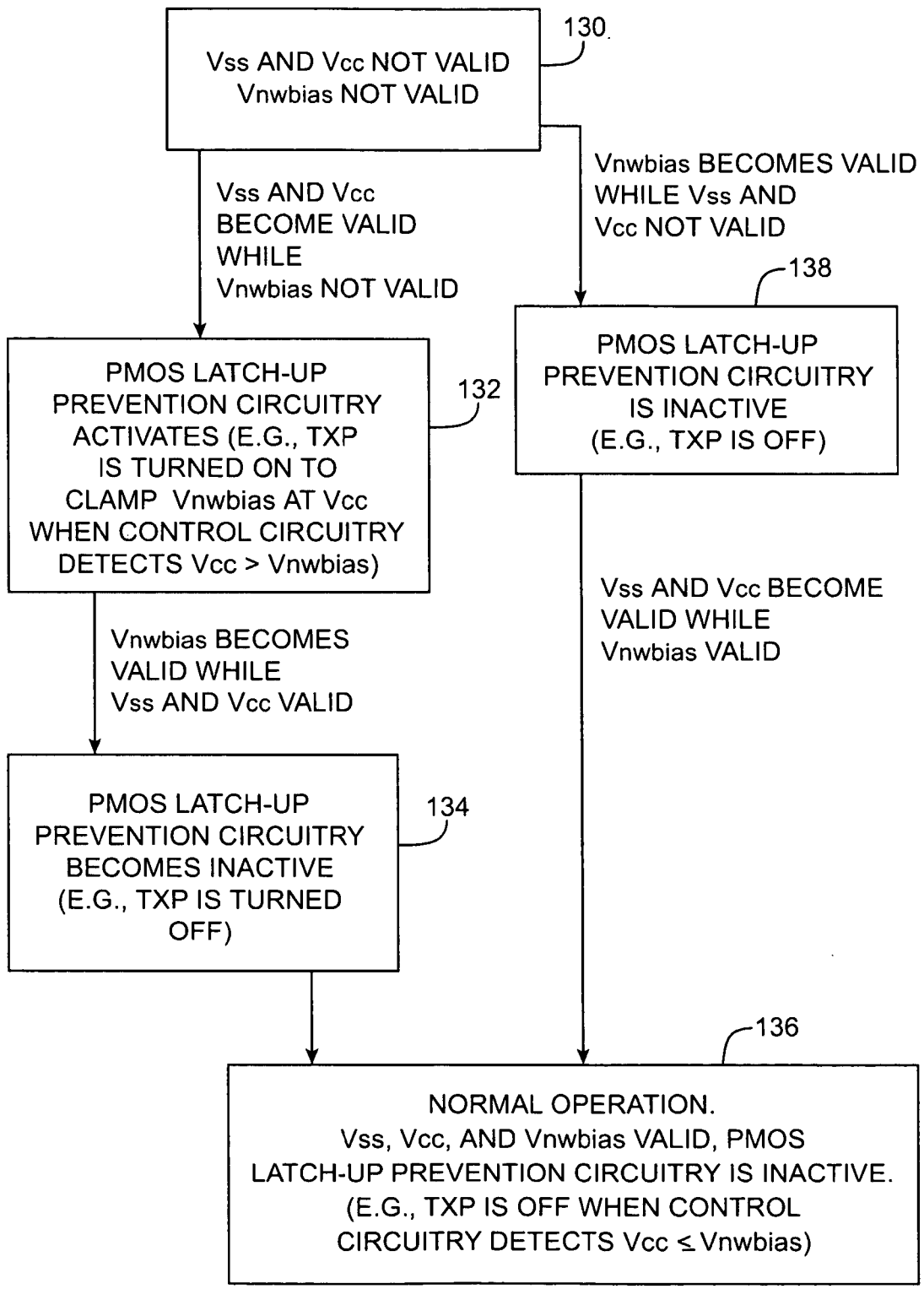
FIG. 9 is a diagram illustrating operations involved in using the p-channel metal-oxide-semiconductor latch-up prevention circuitry of FIG. 6 in preventing latch-up in body-biased p-channel metal-oxide-semiconductor transistors on an integrated circuit such as a programmable logic device integrated circuit in accordance with the present invention.

Operations involved in using PMOS latch-up prevention circuitry 102 such as the PMOS latch-up prevention circuitry of FIGS. 6, 7, and 8 are shown in FIG. 9. Initially, before a user has inserted the integrated circuit 10 into a system, no power supply voltages are applied at the pins 14 of the integrated circuit 10. As a result, the signals Vcc, Vss, and Vnwbias are floating (box 130). The way in which the PMOS latch-up prevention circuitry 102 operates depends on the order in which the signals Vcc, Vss, and Vnwbias are powered.

If Vss and Vcc become valid while Vnwbias is not valid, the PMOS latch-up prevention circuitry will activate to prevent latch-up. In particular, the PMOS latch-up prevention circuitry 102 will use circuitry 112 of FIG. 8 to detect this condition and will turn transistor TXP on (box 132). Turning transistor TXP on creates a low resistance path between terminal 116 and line 104 (FIG. 7), so the signal on the Vnwbias lines in the integrated circuit are clamped at Vcc. Holding Vnwbias at Vcc prevents Vnwbias from floating and thereby prevents latch-up. If desired, Vnwbias may be held at other safe voltages (e.g., a voltage near to Vcc).

When the Vnwbias signal becomes valid, the PMOS latch-up prevention circuitry becomes inactive (box 134). Under these conditions, the transistor TXP is turned off, so the voltage on line 104 (FIG. 7) can be maintained at a desired value of Vnwbias.

With the integrated circuit 10 powered by valid Vcc, Vss, and Vnwbias signals, the circuitry on the integrated circuit can operate normally (box 136). The PMOS latch-up prevention circuitry 102 is inactive and transistor TXP is off.

If, following the initial state of box 130, the signal Vnwbias becomes valid before Vss and Vcc are valid, the PMOS latch-up prevention circuitry 102 remains inactive, as shown by box 138. Because the value of Vnwbias is never less than or equal to Vcc in this situation, the control signal SELV is never taken low and transistor TXP remains off. After Vss and Vcc become valid, the integrated circuit 10 operates normally (box 136).

As this example demonstrates, under some conditions, such as those represented by the right-hand branch of FIG. 9, the PMOS latch-up prevention circuitry is never activated. There is never a need to clamp Vnwbias at a safe voltage, because the voltage Vnwbias becomes valid before Vcc and Vss. Under other conditions, however, such as those represented by the left-hand branch of FIG. 9, the PMOS latch-up prevention circuitry activates when a potential latch-up scenario is detected. During activation, a control signal is generated that turns transistor TXP on. Transistor TXP remains on and line Vnwbias is held at Vcc until all signals are valid and the risk of latch-up has passed.

Figure 10:
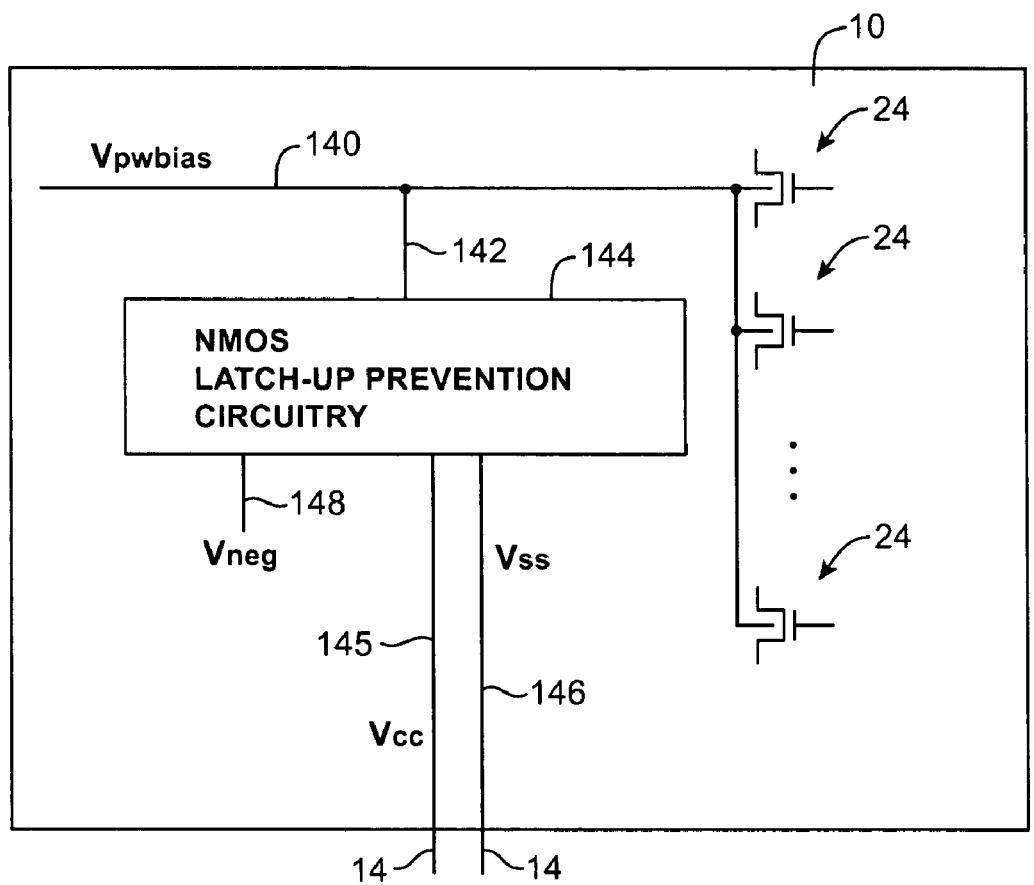
FIG. 10 is a circuit diagram of illustrative circuitry that prevents latch-up in body-biased n-channel metal-oxide-semiconductor transistors in accordance with the present invention.

An illustrative programmable logic device integrated circuit 10 with NMOS latch-up prevention circuitry is shown in FIG. 10. NMOS latch-up prevention circuitry such as NMOS latch-up prevention circuitry 144 of FIG. 10 and PMOS latch-up prevention circuitry such as PMOS latch-up prevention circuitry 102 of FIG. 6 are typically used on the same integrated circuit 10 at the same time. The operation of PMOS latch-up prevention circuitry 102 and NMOS latch-up prevention circuitry 144 are described separately in connection with FIGS. 6 and 10 for clarity.

As shown in FIG. 10, NMOS latch-up prevention circuitry 144 receives ground signal Vss and positive power supply signal Vcc from external sources via pins 14 and paths 146 and 145. Line 140 receives body bias signal Vpwbias from an external source 22 (FIG. 2) or from an internal source such as body bias generator 28 of FIG. 3. During normal operation of integrated circuit 10, lines such as Vpwbias line 140 are used to distribute the body bias signal Vpwbias to NMOS transistors 24. There may be any suitable number of different NMOS body bias signals on circuit 10. The use of a single body bias Vpwbias is shown in FIG. 10 as an example.

The NMOS latch-up prevention circuitry is connected to Vpwbias line 140 via path 142. When a potential latch-up condition is detected, the NMOS latch-up prevention circuitry clamps the voltage on line 140 at a safe value such as Vss. The NMOS latch-up prevention circuitry releases line 140 when power-up operations are complete and all power supply signals are valid.

With one suitable approach, the NMOS latch-up prevention circuitry 144 monitors Vss and Vcc. NMOS latch-up prevention circuitry 144 also monitors Vpwbias or a signal associated with Vpwbias. The monitored signals are compared to determine whether a potential latch-up condition exists.

As shown by the example of FIG. 3, one suitable Vpwbias generation circuit 28 generates an internal negative power supply voltage Vneg from an elevated positive power supply voltage Vccpd (e.g., a positive power supply voltage of about 2.5 volts that is used to power circuitry such as predrivers in input-output circuitry 12 of FIG. 1 that lies around the periphery of integrated circuit 10). Unless the voltage Vneg is present on line 36 of FIG. 3, the body bias voltage Vpwbias cannot be properly generated by NMOS body bias generator 28. Accordingly, NMOS latch-up prevention circuitry 144 can monitor the status of the signal Vpwbias by monitoring the status of Vneg on line 148 of FIG. 10 (which is connected to line 36 in FIG. 3).

In situations in which Vpwbias is generated externally, line 148 is omitted and NMOS latch-up prevention circuitry 144 monitors the voltage on Vpwbias line 140 directly, rather than monitoring the precursor signal Vneg. The operation of the NMOS latch-up prevention circuitry 144 is described in connection with internal body bias generation schemes and signal monitoring arrangements based on measurements of Vneg as an example. If desired, however, external body biasing schemes of the type shown in FIG. 2 may be used. The operation of the NMOS latch-up prevention circuitry 144 is the same, regardless of whether the value of an internal signal such as Vneg is being monitored or whether the externally-generated body bias signal Vpwbias is being monitored.

The NMOS body bias generator 28 of FIG. 3 generates the signal Vneg using power supply signals Vcc, Vss, and Vccpd. When the integrated circuit 10 is powered up (e.g., when a user inserts a device in which integrated circuit 10 is contained into a socket), power supply signals such as Vcc, Vss, and Vccpd are applied to corresponding power supply lines in a given order. The order in which the power supply signals Vcc, Vss, and Vccpd become valid cannot be determined in advance, because no power-up restrictions are placed on integrated circuit 10.

If NMOS latch-up prevention circuitry 144 determines that the signals Vss and Vcc have become valid before the signal Vpwbias is valid, the NMOS latch-up prevention circuitry 144 can hold the voltage on line 140 at Vss or another suitable safe voltage. Once the signal Vneg becomes valid—indicating that the signal Vpwbias is valid—the NMOS latch-up prevention circuitry 144 can release line 140. This allows the Vpwbias signal to be used for normal body biasing of transistors 24. Because Vpwbias is not allowed to float while Vcc and Vss are valid, the latch-up scenario described in connection with FIG. 5 is avoided.

The states of Vcc, Vss, and Vpwbias can be monitored using any suitable approach. With one approach, the state of Vpwbias is compared to the states of Vss and Vcc by comparing Vneg to a signal Vbias that is close in value to Vss, rather than comparing Vpwbias to Vss or Vcc or comparing Vneg to Vss or Vcc directly.

Other approaches may be used if desired. For example, because Vneg is obtained from the power supply Vccpd in the NMOS body bias generator 28, the state of Vccpd is indicative of the state of Vneg. If Vccpd is determined to be floating, the signal Vneg cannot be valid. It is generally preferred to make direct measurements on Vneg rather than on its precursor Vccpd, because the state of Vneg is most directly related to the state of Vpwbias. Nevertheless, less direct measurements such as measurements on Vccpd or other precursor supply voltages associated with the production of Vpwbias may be made if desired. NMOS latch-up prevention circuitry 144 can also compare Vneg to Vss directly, instead of comparing Vneg and Vbias.

Although any suitable signal monitoring scheme may be used to determine when to activate the NMOS latch-up prevention circuitry 144, the use of the signal monitoring arrangement in which the state of Vpwbias is compared to the states of Vss and Vcc by comparing the voltages of internal signals Vneg and Vbias is described as an example.

Figure 11:
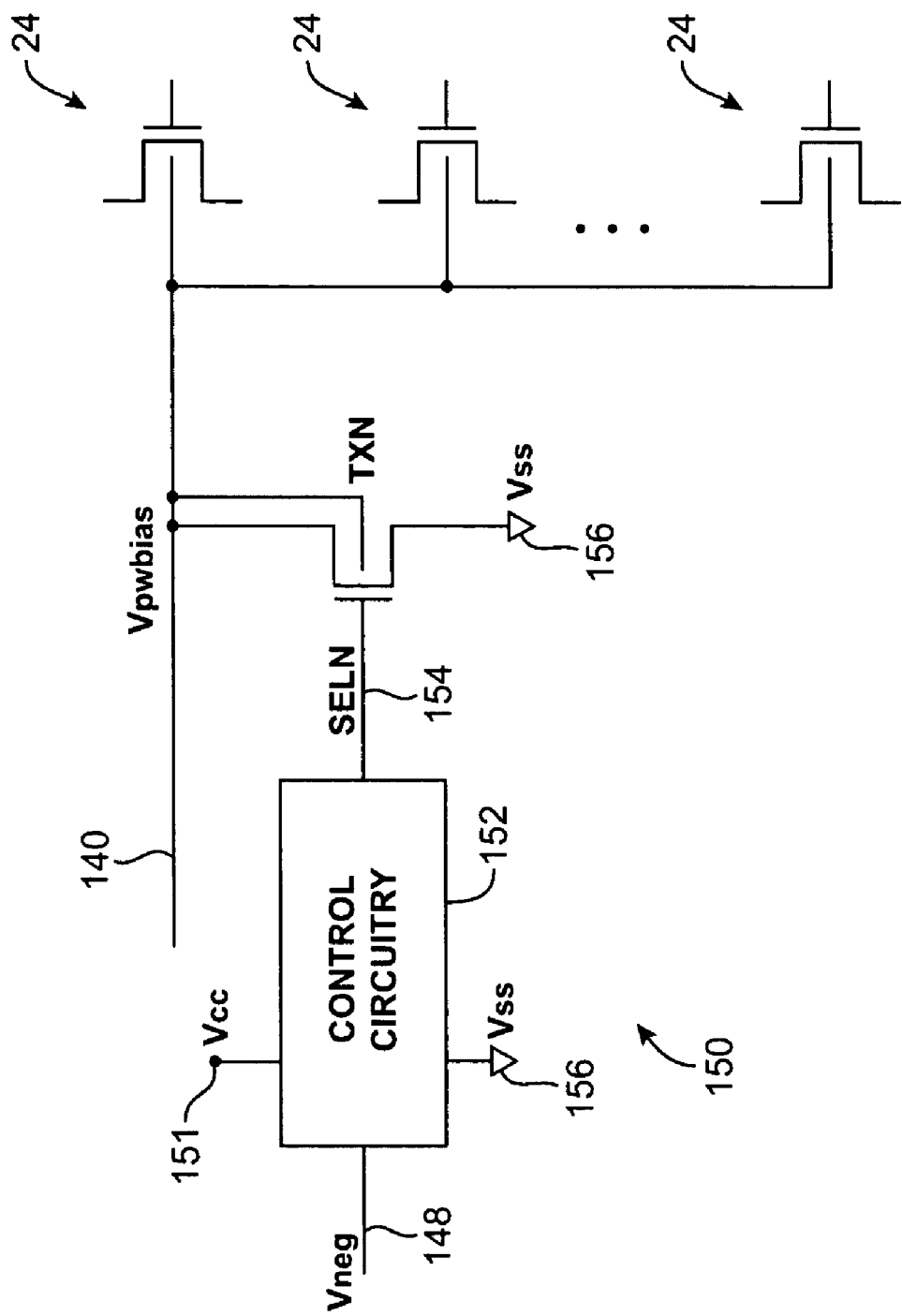
FIG. 11 is a circuit diagram of illustrative latch-up prevention circuitry of the type shown in FIG. 10 in accordance with the present invention.

Illustrative circuitry 150 that may be used for NMOS latch-up prevention circuitry 144 is shown in FIG. 11. As shown in FIG. 11, circuitry 150 includes control circuitry 152 and transistor TXN. The NMOS body bias path 140 is used to distribute the body bias signal Vpwbias to the body terminals of NMOS transistors 24. Control circuitry 152 receives power supply signal Vcc at terminal 151 and ground is applied to circuitry 150 using terminals 156. The signal Vneg from path 36 of FIG. 2 is provided to control circuitry 152 via path 148.

During operation, control circuitry 152 monitors the signals Vneg, Vcc, and Vss and generates a corresponding control signal SELN at its output. The control signal SELN is applied to the gate of transistor TXN on path 154. One of the drain-source terminals of transistor TXN is connected to ground terminal 156 and receives signal Vss. The other drain-source terminal of transistor TXN and the body terminal of transistor TXN are connected to body bias distribution path 140.

If control circuitry 152 detects that Vneg is not valid while Vcc and Vss are valid, control circuitry 152 generates a high value of SELN at its output. The high value of SELN turns on transistor TXN and electrically connects line 140 to ground signal Vss at terminal 156. As long as transistor TXN is on, the voltage on line 140 will remain clamped at Vss. When control circuitry 152 detects that the Vpwbias signal on line 140 has become valid (e.g., by detecting a valid Vneg signal), control circuitry 152 generates a low value of SELN at its output. The low SELN signal turns off transistor TXN and allows the Vpwbias voltage to be applied as a body bias to NMOS transistors 24.

Figure 12:
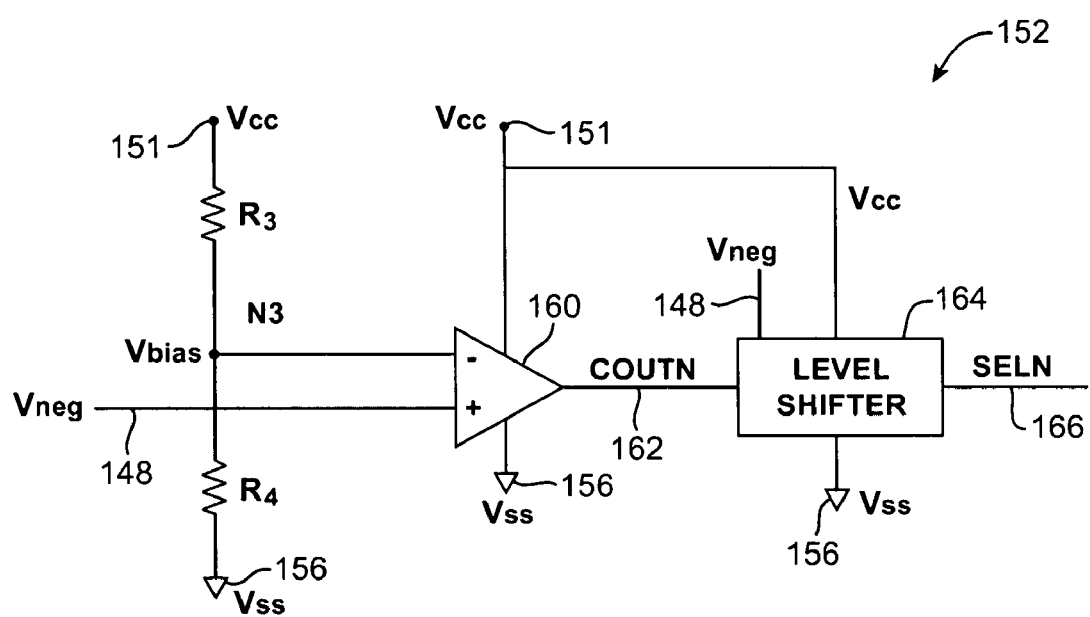
FIG. 12 is a circuit diagram of illustrative control circuitry that may be used in latch-up prevention circuitry of the type shown in FIG. 11 in accordance with the present invention.

One suitable circuit arrangement that can be used for control circuitry 152 of FIG. 11 is shown in FIG. 12. In the example of FIG. 12, control circuitry 152 receives the power supply signal Vcc via terminals 151. The negative voltage Vneg from line 36 of FIG. 2 is received at line 148. Ground signal Vss is received at terminals 156. Control circuitry 152 has a resistor network formed from resistors R3 and R4. The resistors R3 and R4 form a voltage divider. The values of resistances R3 and R4 are chosen so that a small bias voltage Vbias (e.g., 100 mV) is generated at node N3 when Vcc and Vss are valid. The voltage Vbias is applied to the negative input of comparator 160. The positive input of comparator 160 receives the signal Vneg on line 148. Comparator 160 preferably uses a native NMOS transistor with a negative threshold voltage, so comparator 160 is theoretically able to compare Vneg to a signal such as Vss that is at 0 volts. To ensure that comparator 160 will be functional under expected input conditions, a non-zero voltage Vbias of 100 mV is provided as an input to comparator 160, rather than the voltage Vss. If desired, other designs may be used (e.g., using comparators based on PMOS transistors, etc.).

In operation, comparator 160 compares the signals on its inputs and produces a corresponding output signal COUTN its output. When Vpwbias, Vcc, and Vss are valid, the value of Vpwbias will be negative (i.e., less than Vss). In this situation, Vneg will be less than or equal to Vbias and the signal COUTN will be low. If Vpwbias is not valid (i.e., Vpwbias is floating and is not less than Vss), the value of Vneg will be greater than Vbias and the signal COUTN will be high.

The signal COUTN ranges from a low of Vss to a high of Vcc. The COUTN signal on line 162 is level shifted using level shifter 164. The resulting level-shifted version of the signal COUTN is provided as control signal SELN on line 166. Level shifter 164 is powered using voltage Vcc from terminal 151, voltage Vneg from terminal 148, and ground voltage Vss at terminal 156. When COUTN is low at Vss, the signal SELN is low at Vneg. When COUTN is high at Vcc, the signal SELN is high at Vcc.

Figure 13:
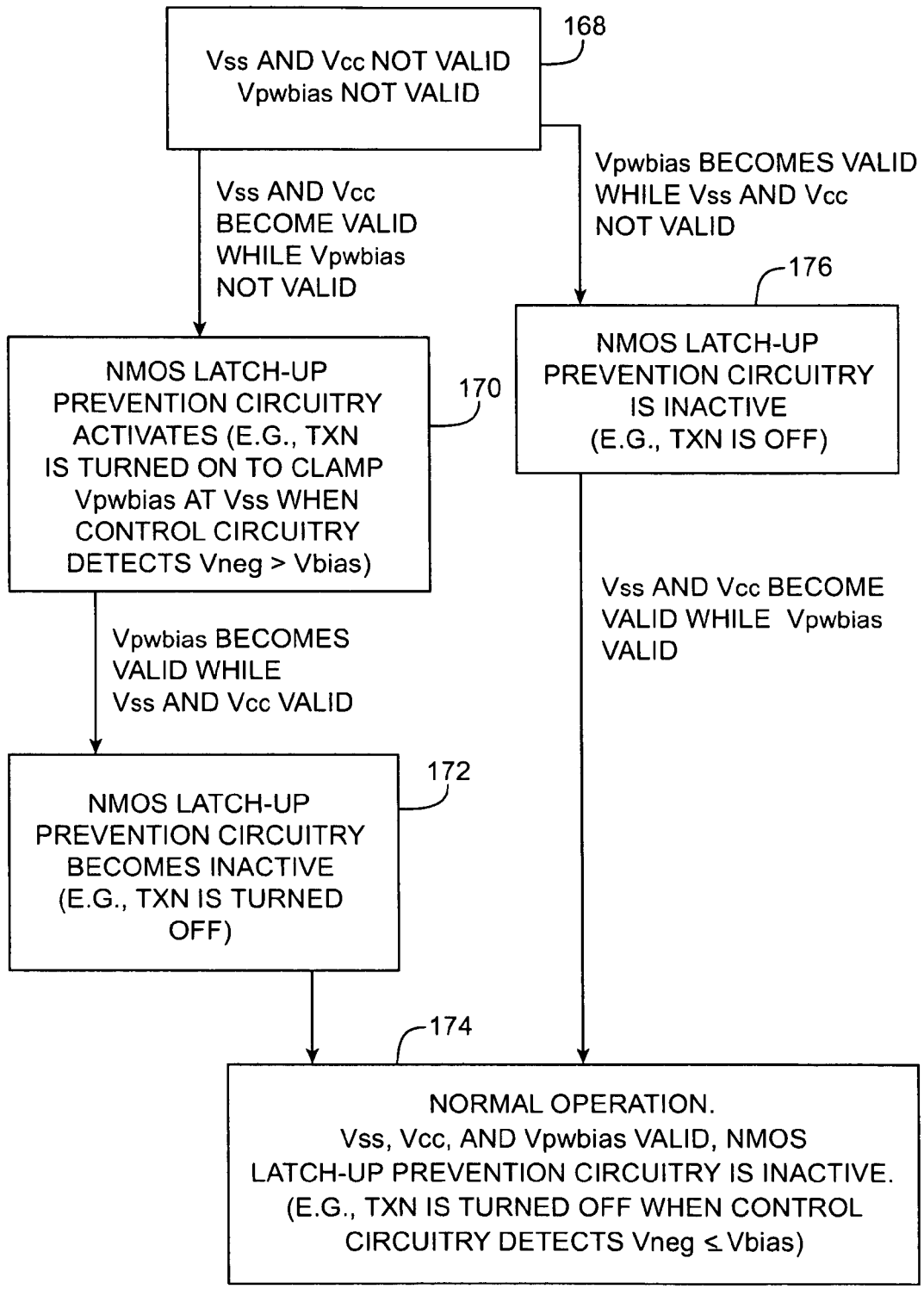
FIG. 13 is a diagram illustrating operations involved in using the n-channel metal-oxide-semiconductor latch-up prevention circuitry of FIG. 10 in preventing latch-up in body-biased n-channel metal-oxide-semiconductor transistors on an integrated circuit such as a programmable logic device integrated circuit in accordance with the present invention.

Operations involved in using NMOS latch-up prevention circuitry such as the NMOS latch-up prevention circuitry of FIGS. 10, 11, and 12 are shown in FIG. 13. Initially, before a user has inserted the integrated circuit 10 into a system, no power supply voltages are applied at the pins 14 of the integrated circuit 10. As a result, the signals Vcc, Vss, and Vpwbias are floating (box 130). The way in which the NMOS latch-up prevention circuitry 144 operates depends on the order in which the signals Vcc, Vss, and Vpwbias are powered.

If Vss and Vcc become valid while Vpwbias is not valid, the NMOS latch-up prevention circuitry will detect this situation and will activate to prevent latch-up. In particular, the NMOS latch-up prevention circuitry 144 will use circuitry 152 of FIG. 12 to detect this condition and will turn transistor TXN on (box 170). Turning transistor TXN on creates a low resistance path between ground terminal 156 and line 140 (FIG. 11), so the signal on the Vpwbias lines in the integrated circuit are clamped at Vss. Holding Vpwbias at Vss prevents Vpwbias from floating and thereby prevents latch-up. If desired, Vpwbias can be clamped at other safe voltages instead of Vss (e.g., voltages near to Vss).

When the Vpwbias signal becomes valid, the NMOS latch-up prevention circuitry becomes inactive (box 172). Under these conditions, the transistor TXN is turned off, so the voltage on line 140 (FIGS. 10 and 11) can be maintained at a desired value of Vpwbias.

With the integrated circuit 10 powered by valid Vcc, Vss, and Vpwbias signals, the circuitry on the integrated circuit can operate normally (box 174). The NMOS latch-up prevention circuitry 144 is inactive and transistor TXN is off.

If, following the initial state of box 168, the signal Vpwbias becomes valid before Vss and Vcc are valid (e.g., because precursor power supply voltage Vccpd becomes valid so that NMOS body bias generator 28 produces a valid Vneg signal and valid Vpwbias signal), the NMOS latch-up prevention circuitry 144 remains inactive, as shown by box 176. Because the value of Vneg is never greater than Vbias in this situation, the control signal SELN is never taken high and transistor TXN remains off.

After Vss and Vcc become valid, the integrated circuit 10 operates normally (box 174).

As this example demonstrates, under some conditions, such as those represented by the right-hand branch of FIG. 13, the NMOS latch-up prevention circuitry is never activated. There is never a need to clamp Vpwbias at a safe voltage, because the voltage Vpwbias becomes valid before Vcc and Vss. Under other conditions, however, such as those represented by the left-hand branch of FIG. 13, the NMOS latch-up prevention circuitry activates when a potential latch-up scenario is detected. During activation, a control signal is generated that turns transistor TXN on. Transistor TXN remains on and line Vpwbias is held at Vss until all signals are valid and the risk of latch-up has passed.

The active PMOS latch-up prevention scheme described in connection with FIGS. 6-9 and the active NMOS latch-up prevention scheme described in connection with FIGS. 10-13 are preferably both used on integrated circuit 10 to prevent latch-up. If desired, however, one or both of these active latch-up prevention techniques may be replaced or supplemented using a passive latch-up prevention scheme.

Figure 14:
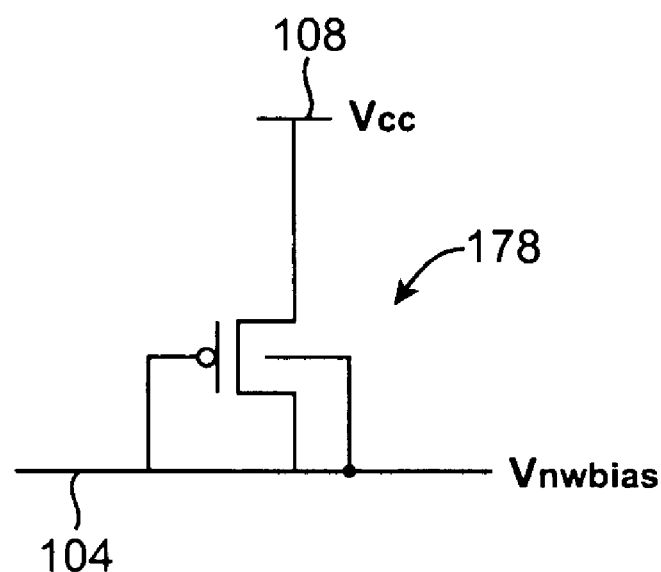
FIGS. 14 and 15 are circuit diagrams of illustrative passive latch-up prevention schemes in accordance with the present invention.

An illustrative passive latch-up prevention circuit for PMOS transistors 26 is shown in FIG. 14. As shown in FIG. 14, a diode formed from a diode-connected transistor 178 is connected between Vcc line 108 and Vnwbias line 104. The diode 178 turns on whenever the voltage signal Vnwbias drops to one diode turn-on voltage below Vcc. This prevents the voltage on line 104 from falling below Vcc by more than one diode turn-on voltage and therefore prevents the emitter-base junction of the parasitic PNP transistor from becoming forward biased. There is not much margin in this design, because in some situations the emitter-base junction will be biased near its turn-on voltage. Nevertheless, passive latch-up prevention circuits can be advantageous in scenarios in which it is desired to minimize circuit complexity and conserve real estate on the integrated circuit.

Figure 15:
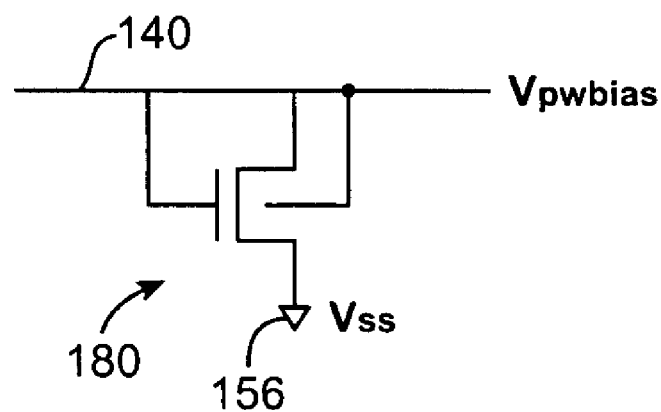

An illustrative passive latch-up prevention circuit for NMOS transistors 26 is shown in FIG. 15. The passive NMOS transistor latch-up circuit has a diode formed from a diode-connected transistor 180 that is connected between Vss terminal 156 and Vpwbias line 140. The diode 180 turns on whenever the voltage signal Vpwbias rises to one diode turn-on voltage above Vss. This prevents the voltage on line 140 from rising above Vss by more than one diode turn-on voltage and therefore prevents the base-emitter junction of parasitic bipolar transistor NPN2 from becoming forward biased. As with the passive PMOS latch-up prevention scheme of FIG. 14, there is not much margin in the circuit design of FIG. 15. In some situations the base-emitter junction of NPN2 will be biased near its turn-on voltage. Nevertheless, passive latch-up prevention circuits can be advantageous in scenarios in which it is desired to minimize circuit complexity and conserve real estate on the integrated circuit.

The foregoing is merely illustrative of the principles of this invention and various modifications can be made by those skilled in the art without departing from the scope and spirit of the invention.

What is claimed is:

1. An integrated circuit comprising:
   metal-oxide-semiconductor transistors each of which has a body terminal;
   input-output pins with which power supply signals are supplied to the integrated circuit;
   a body bias path that distributes a body bias signal to the body terminals of the metal-oxide-semiconductor transistors;
   active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and
   body bias generation circuitry that generates the body bias signal that is applied to the body bias path, wherein the active latch-up prevention circuitry comprises circuitry that monitors at least one signal from the body bias generation circuitry to determine whether the body bias signal is valid.

2. The integrated circuit defined in claim 1, wherein the input-output pins comprises input-output pins that receive a positive power supply signal and a ground power supply signal and wherein the active latch-up prevention circuitry comprises circuitry that monitors the positive power supply signal and the ground power supply signal to determine whether the positive power supply signal and the ground power supply signal are valid.

3. The integrated circuit defined in claim 1, wherein the body bias generation circuitry comprises a charge pump circuit that generates a negative voltage signal and wherein the active latch-up prevention circuitry comprises circuitry that monitors the negative voltage signal from the body bias generation circuitry to determine whether the body bias signal on the body bias path is valid.

4. The integrated circuit defined in claim 1, wherein the power supply signals comprise a core circuitry positive power supply signal, wherein the body bias generation circuitry comprises a charge pump circuit that generates a negative voltage signal and wherein the active latch-up prevention circuitry comprises circuitry that monitors the negative voltage signal from the body bias generation circuitry to determine whether the body bias signal on the body bias path is valid and comprises a transistor that is turned on to clamp the body bias path at a given voltage to prevent latch-up in the metal-oxide-semiconductor transistors when the body bias signal is not valid and at least the core circuitry positive power supply signal is valid.

5. The integrated circuit defined in claim 1 further comprising:
a core power supply path to which a core positive power supply voltage is applied from one of the input-output pins that powers core circuitry on the integrated circuit, wherein:
the metal-oxide-semiconductor transistors comprise p-channel metal-oxide-semiconductor transistors with body bias terminals;
the body bias path is connected to the body terminals of the p-channel metal-oxide-semiconductor transistors; and
the active latch-up prevention circuitry comprises a transistor that is connected between the core positive power supply voltage path and the body bias path and wherein when the active latch-up prevention circuitry detects a potential latch-up condition for the p-channel metal-oxide-semiconductor transistors, the active latch-up prevention circuitry turns on the transistor that is connected between the core positive power supply voltage path and the body bias path to clamp the body bias path at the core positive power supply voltage.

6. An integrated circuit comprising:
metal-oxide-semiconductor transistors each of which has a body terminal;
input-output pins with which power supply signals are supplied to the integrated circuit;
a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and
a core power supply path to which a core positive power supply voltage is applied from one of the input-output pins that powers core circuitry on the integrated circuit, wherein:
the metal-oxide-semiconductor transistors comprise p-channel metal-oxide-semiconductor transistors with body bias terminals;
the body bias path is connected to the body terminals of the p-channel metal-oxide-semiconductor transistors; and
the active latch-up prevention circuitry comprises a transistor that is connected between the core positive power supply voltage path and the body bias path, wherein the active latch-up prevention circuitry comprises control circuitry that includes a comparator, wherein the control circuitry produces a control signal that controls the transistor that is connected between the core positive power supply voltage path and the body bias path, and wherein when the active latch-up prevention circuitry detects a potential latch-up condition for the p-channel metal-oxide-semiconductor transistors, the control signal produced by the control circuitry turns on the transistor that is connected between the core positive power supply voltage path and the body bias path to clamp the body bias path at the core positive power supply voltage.

7. An integrated circuit comprising:
metal-oxide-semiconductor transistors each of which has a body terminal;
input-output pins with which power supply signals are supplied to the integrated circuit;
a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and
a core power supply path to which a core positive power supply voltage is applied from one of the input-output pins that powers core circuitry on the integrated circuit, wherein:
the metal-oxide-semiconductor transistors comprise p-channel metal-oxide-semiconductor transistors with body bias terminals;
the body bias path is connected to the body terminals of the p-channel metal-oxide-semiconductor transistors; and
the active latch-up prevention circuitry comprises a transistor that is connected between the core positive power supply voltage path and the body bias path, wherein the active latch-up prevention circuitry comprises control circuitry that includes a comparator, wherein one input to the comparator receives a voltage that is proportional to the core positive power supply voltage and is indicative of whether the core positive power supply voltage and a ground voltage are valid, wherein another input to the comparator receives a voltage that is proportional to the body bias signal, wherein the comparator compares its inputs and produces a corresponding control signal at its output that controls the transistor that is connected between the core positive power supply voltage path and the body bias path, and wherein when the active latch-up prevention circuitry detects a potential latch-up condition for the p-channel metal-oxide-semiconductor transistors based on a comparison of the inputs to the comparator, the control signal produced by the comparator turns on the transistor that is connected between the core positive power supply voltage path and the body bias path to clamp the body bias path at the core positive power supply voltage.

8. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and a ground power supply path to which a ground voltage is applied from one of the input-output pins, wherein:

the metal-oxide-semiconductor transistors comprise n-channel metal-oxide-semiconductor transistors with body bias terminals;

the body bias path is connected to the body terminals of the n-channel metal-oxide-semiconductor transistors; and the active latch-up prevention circuitry comprises a transistor that is connected between the ground power supply path and the body bias path and wherein when the active latch-up prevention circuitry detects a potential latch up condition for the n-channel metal-oxide-semiconductor transistors, the active latch-up prevention circuitry turns on the transistor that is connected between the ground power supply path and the body bias path to clamp the body bias path at the ground power supply voltage.

9. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and a ground power supply path to which a ground voltage is applied from one of the input-output pins, wherein:

the metal-oxide-semiconductor transistors comprise n-channel metal-oxide-semiconductor transistors with body bias terminals;

the body bias path is connected to the body terminals of the n-channel metal-oxide-semiconductor transistors; and the active latch-up prevention circuitry comprises a transistor that is connected between the ground power supply voltage path and the body bias path, wherein the active latch-up prevention circuitry comprises control circuitry that includes a comparator, wherein the control circuitry produces a control signal that controls the transistor that is connected between the ground power supply voltage path and the body bias path, and wherein when the active latch-up prevention circuitry detects a potential latch-up condition for the n-channel metal-oxide-semiconductor transistors, the control signal produced by the control circuitry turns on the transistor that is connected between the ground power supply voltage path and the body bias path to clamp the body bias path at the ground power supply voltage.

10. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and a ground power supply path to which a ground voltage is applied from one of the input-output pins, wherein:

the metal-oxide-semiconductor transistors comprise n-channel metal-oxide-semiconductor transistors with body bias terminals;

the body bias path is connected to the body terminals of the n-channel metal-oxide-semiconductor transistors; and the active latch-up prevention circuitry comprises a transistor that is connected between the ground power supply voltage path and the body bias path, wherein the active latch-up prevention circuitry comprises control circuitry that includes a comparator, wherein one input to the comparator receives a voltage that is associated with the ground power supply voltage and is indicative of whether the ground power supply voltage and a positive core logic power supply voltage are valid, wherein another input to the comparator receives a voltage that is indicative of whether the body bias signal is valid, wherein the comparator compares its inputs and produces a corresponding control signal at an output that controls the transistor that is connected between the ground power supply voltage path and the body bias path, and wherein when the active latch-up prevention circuitry detects a potential latch-up condition for the n-channel metal-oxide-semiconductor transistors based on a comparison of the inputs to the comparator, the control signal produced by the comparator turns on the transistor that is connected between the ground power supply voltage path and the body bias path to clamp the body bias path at the ground power supply voltage.

11. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present; and
programmable elements that are loaded with configuration data, and wherein the active latch-up prevention circuitry comprises active n-channel latch-up prevention circuitry and active p-channel latch-up prevention circuitry.

12. An integrated circuit comprising:
metal-oxide-semiconductor transistors each of which has a body terminal;
input-output pins with which power supply signals are supplied to the integrated circuit;
a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present;
n-channel metal-oxide-semiconductor active latch-up prevention circuitry in the active latch-up prevention circuitry that prevents the metal-oxide-semiconductor transistors from becoming latched up when a core logic power supply voltage and a ground power supply voltage received through the input-output pins become valid while the body bias signal on the body bias path is floating; and
at least one passive latch-up prevention circuit that includes a diode-connected transistor.

13. An integrated circuit comprising:
metal-oxide-semiconductor transistors each of which has a body terminal;
input-output pins with which power supply signals are supplied to the integrated circuit;
a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present, wherein the metal-oxide-semiconductor transistors comprise n-channel metal-oxide-semiconductor transistors;
a core logic positive power supply path that receives a core logic positive power supply signal from one of the input-output pins;
a ground power supply path that receives a ground power supply signal from one of the input-output pins;
an elevated power supply path that receives an elevated power supply signal from one of the input-output pins that is larger than the core logic power supply signal; and an n-channel metal-oxide-semiconductor transistor body bias generator that receives the core logic power supply signal, the ground power supply signal, and the elevated power supply signal and that produces a negative voltage, wherein the n-channel metal-oxide-semiconductor transistor body bias generator uses the negative voltage in generating the body bias signal for the n-channel metal-oxide-semiconductor transistors, wherein the active latch-up prevention circuitry comprises a transistor that is connected between the body bias path and the ground power supply path and that is turned on by the active latch-up prevention circuitry when the active latch-up prevention circuitry determines that the core logic positive power supply signal and ground signal are valid while the negative voltage is not valid, wherein when the transistor is turned on, the ground power supply signal is applied to the body bias path.

14. An integrated circuit comprising:
metal-oxide-semiconductor transistors each of which has a body terminal;
input-output pins with which power supply signals are supplied to the integrated circuit;
a body bias path that distributes a body bias signal to the body terminals of the metal-oxide-semiconductor transistors;
active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present, wherein the metal-oxide-semiconductor transistors comprise n-channel metal-oxide-semiconductor transistors;
a core logic positive power supply path that receives a core logic positive power supply signal from one of the input-output pins;
a ground power supply path that receives a ground power supply signal from one of the input-output pins;
an elevated power supply path that receives an elevated power supply signal from one of the input-output pins that is larger than the core logic power supply signal; and
an n-channel metal-oxide-semiconductor transistor body bias generator that receives the core logic power supply signal, the ground power supply signal, and the elevated power supply signal and that produces a negative voltage, wherein the n-channel metal-oxide-semiconductor transistor body bias generator uses the negative voltage in generating the body bias signal for the n-channel metal-oxide-semiconductor transistors, wherein the active latch-up prevention circuitry comprises:
a comparator having an output, having a first input that receives the negative voltage, and having a second input that receives a bias voltage that is valid when the core logic positive power supply signal and the ground power supply signal are valid, wherein the comparator compares the first input and the second input and produces a corresponding control signal at an output;
a level shifter that receives the control signal from the comparator and that generates a corresponding level-shifted version of the control signal; and
a transistor having a gate that receives the level-shifted version of the control signal and that is connected between the body bias path and the ground power supply path, wherein when the negative voltage is less than the bias voltage the level-shifted control signal has a first state that turns off the transistor that is connected between the body bias path and the ground power supply path and wherein when the negative voltage is greater than the bias voltage the level-shifted control signal has a second state that turns on the transistor that is connected between the body bias path and the ground power supply path so that the ground power supply signal is applied to the body bias path to prevent latch-up.

15. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latch-up condition is present, wherein the metal-oxide-semiconductor transistors comprise p-channel metal-oxide-semiconductor transistors;

a core logic positive power supply path that receives a core logic positive power supply signal from one of the input-output pins;

a ground power supply path that receives a ground power supply signal from one of the input-output pins; and a p-channel metal-oxide-semiconductor transistor body bias generator that receives at least the core logic power supply signal and the ground power supply signal, wherein the p-channel metal-oxide-semiconductor transistor body bias generator applies the body bias signal to the body bias path, wherein the active latch-up prevention circuitry comprises:

a comparator having an output, having a first input that receives a first voltage indicative of the body bias signal, and having a second input that receives a second voltage, wherein the comparator compares the first input and the second input and produces a corresponding control signal at its output that has a first state when the core logic positive power supply voltage and the ground power supply signal are valid and the body bias signal is not valid and that has a second state when the core logic positive power supply signal, the ground power supply signal, and the body bias signal are valid.

16. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latched condition is present; wherein the metal-oxide-semiconductor transistors comprise p-channel metal-oxide-semiconductor transistors;

a core logic positive power supply path that receives a core logic positive power supply signal from one of the input-output pins;

a ground power supply path that receives a ground power supply signal from one of the input-output pins; and a p-channel metal-oxide-semiconductor transistor body bias generator that receives at least the core logic power supply signal and the ground power supply signal, wherein the p-channel metal-oxide-semiconductor transistor body bias generator applies the body bias signal to the body bias path, wherein the active latched prevention circuitry comprises:

a comparator having an output, having a first input that receives a first voltage indicative of the body bias signal, and having a second input that receives a second voltage, wherein the comparator compares the first input and the second input and produces a corresponding control signal at its output that has a first state when the core logic positive power supply voltage and the ground power supply signal are valid and the body bias signal is not valid and that has a second state when the core logic positive power supply signal, the ground power supply signal, and the body bias signal are valid; and a transistor having a gate to which the control signal is applied and that is connected between the body bias path and the core logic positive power supply path, wherein when the control signal has the first state the control signal turns on the transistor that is connected between the body bias path and the core logic positive power supply path so that the positive power supply signal is applied to the body bias path to prevent latch-up and wherein when the control signal has the second state, the control signal turns off the transistor that is connected between the body bias path and the core logic positive power supply path so that the body bias signal applied to the body bias path by the p-channel metal-oxide-semiconductor transistor body bias generator biases the body terminals of the p-channel metal-oxide-semiconductor transistors.

17. An integrated circuit comprising:

metal-oxide-semiconductor transistors each of which has a body terminal;

input-output pins with which power supply signals are supplied to the integrated circuit;

a body bias path that distributes a body bias signal to the body terminals of the metal-oxide-semiconductor transistors;

active latch-up prevention circuitry that monitors the power supply signals to detect potential latch-up conditions for the metal-oxide-semiconductor transistors and that holds the body bias path at a safe voltage to prevent latch-up in the metal-oxide-semiconductor transistors while the potential latched condition is present;

a positive power supply path that receives a positive power supply signal from one of the input-output pins;

a ground power supply path that receives a ground power supply signal from one of the input-output pins;

a transistor connected to the body bias path and a given one of the power supply paths; and comparator circuitry in the active latch-up prevention circuitry that determines whether the positive power supply signal, the ground power supply signal, and the body bias signal are valid and that turns on the transistor that is connected to the body bias path to electrically connect the body bias path to the given one of the power supply paths when the positive power supply signal and ground power supply signal are valid while the body bias signal is not valid and that turns off the transistor connected to the body bias path to let the body bias signal bias the bodies of the metal-oxide-semiconductor transistors when the positive power supply signal, the ground power supply signal, and the body bias signal are valid.

18. A method for preventing latch-up in metal-oxide-semiconductor transistors on an integrated circuit that has a body bias path that distributes a body bias signal to body terminals of the metal-oxide-semiconductor transistors, comprising:

monitoring power supply signals on the integrated circuit to detect potential latch-up conditions for the metal-oxide-semiconductor transistors;

when a potential latch-up condition is present, holding the body bias path at a safe voltage to prevent latch-up in the metal-oxide-semiconductor transistors, wherein a transistor is connected between the body bias path and a terminal that receives a ground power supply signal;

determining whether the body bias signal on the body bias path is valid;

monitoring a positive power supply signal and the ground power supply signal to determine whether the positive power supply signal and the ground power supply signal are valid; and when the positive power supply signal and ground power supply signal become valid while the body bias signal is not valid, turning on the transistor to apply the ground power supply signal to the body bias path.

19. The method defined in claim 18 wherein the integrated circuit comprises body bias generation circuitry that generates the body bias signal that is applied to the body bias path and wherein monitoring the power supply signals comprises monitoring at least one signal from the body bias generation circuitry to determine whether the body bias signal is valid.

20. The method defined in claim 18 wherein an additional transistor is connected between an additional body bias path and a terminal that receives the positive power supply signal, the method further comprising:

when the positive power supply signal and ground power supply signal become valid while the body bias signal is not valid, turning on the additional transistor to apply the positive power supply signal to the additional body bias path.

21. A programmable logic device integrated circuit comprising:

n-channel metal-oxide-semiconductor transistors each of which has a body terminal;

an n-channel body bias generator that generates an n-channel metal-oxide-semiconductor body bias signal;

a first body bias path that distributes the n-channel metal-oxide-semiconductor body bias signal to the body terminals of the n-channel metal-oxide-semiconductor transistors;

n-channel active latch-up prevention circuitry that prevents the n-channel metal-oxide-semiconductor transistors from experiencing latch up;

p-channel metal-oxide-semiconductor transistors each of which has a body terminal;

a p-channel body bias generator that generates a p-channel metal-oxide-semiconductor body bias signal;

a second body bias path that distributes the p-channel metal-oxide-semiconductor body bias signal to the body terminals of the p-channel metal-oxide-semiconductor transistors; and p-channel active latch-up prevention circuitry that prevents the p-channel metal-oxide-semiconductor transistors from experiencing latch up.

22. The programmable logic device integrated circuit defined in claim 21 further comprising:

n-channel metal-oxide-semiconductor body bias generation circuitry that generates the n-channel metal-oxide-semiconductor body bias signal that is applied to the first body bias path; and p-channel metal-oxide-semiconductor body bias generation circuitry that generates the p-channel metal-oxide-semiconductor body bias signal that is applied to the first body bias path.

23. The programmable logic device integrated circuit defined in claim 21 further comprising:

input-output pins that receive a positive power supply signal and a ground power supply signal, wherein the n-channel active latch-up prevention circuitry comprises comparator circuitry that determines whether the n-channel body bias signal on the first body bias path is valid, whether the positive power supply signal is valid, and whether the ground power supply signal is valid; and a transistor in the n-channel active latch-up prevention circuitry that the n-channel active latch-up prevention circuitry turns on to clamp the first body bias path at the ground power supply signal when the comparator circuitry determines that the positive power supply signal and the ground power supply signal have become valid while the n-channel body bias signal is not valid.

24. The programmable logic device integrated circuit defined in claim 21 further comprising:

input-output pins that receive a positive power supply signal and a ground power supply signal, wherein the p-channel active latch-up prevention circuitry comprises comparator circuitry that determines whether the p-channel body bias signal on the second body bias path is valid, whether the positive power supply signal is valid, and whether the ground power supply signal is valid; and a transistor in the p-channel active latch-up prevention circuitry that the p-channel active latch-up prevention circuitry turns on to clamp the second body bias path at the positive power supply signal when the comparator circuitry determines that the positive power supply signal and the ground power supply signal have become valid while the p-channel body bias signal is not valid.

* * * * *